(12) United States Patent  
Shamma et al.

(10) Patent No.: US 10,192,759 B2  
(45) Date of Patent: Jan. 29, 2019

(54) IMAGE REVERSAL WITH AHM GAP FILL FOR MULTIPLE PATTERNING

(71) Applicant: Lam Research Corporation, Fremont, CA (US)

(72) Inventors: Nader Shamma, Cupertino, CA (US); Bart J. van Schravendijk, Palo Alto, CA (US); Sirish K. Reddy, Portland, OR (US); Chunhai Ji, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 346 days.

(21) Appl. No.: 15/150,239

(22) Filed: May 9, 2016

(65) Prior Publication Data

US 2016/0254171 A1    Sep. 1, 2016

Related U.S. Application Data

(62) Division of application No. 14/101,901, filed on Dec. 10, 2013, now Pat. No. 9,362,133.

(Continued)

(51) Int. Cl.
*C23C 16/00* (2006.01)
*H01L 21/306* (2006.01)
(Continued)

(52) U.S. Cl.
CPC ...... *H01L 21/67069* (2013.01); *H01J 37/321* (2013.01); *H01J 37/32082* (2013.01);
(Continued)

(58) Field of Classification Search
CPC ............... H01J 37/321; H01J 37/3211; H01J 37/32119; H01J 37/32128;
(Continued)

(56) References Cited

U.S. PATENT DOCUMENTS 3,816,976 A   6/1974  Stork et al.
4,209,357 A   6/1980  Gorin et al.
(Continued)

FOREIGN PATENT DOCUMENTS

CN   1735945 A   2/2006
CN   101017834 A   8/2007
(Continued)

OTHER PUBLICATIONS

Tan et al., U.S. Appl. No. 14/692,627, filed Apr. 21, 2015 entitled "Gap Fill Using Carbon-Based Films."
(Continued)

*Primary Examiner* — Luz L Alejandro Mulero
(74) *Attorney, Agent, or Firm* — Weaver Austin Villeneuve & Sampson LLP

(57) ABSTRACT

Methods and apparatuses for multiple patterning using image reversal are provided. The methods may include depositing gap-fill ashable hardmasks using a deposition-etch-ash method to fill gaps in a pattern of a semiconductor substrate and eliminating spacer etching steps using a single-etch planarization method. Such methods may be performed for double patterning, multiple patterning, and two dimensional patterning techniques in semiconductor fabrication.

16 Claims, 12 Drawing Sheets

Related U.S. Application Data

(60) Provisional application No. 61/737,688, filed on Dec. 14, 2012.

(51) Int. Cl.

| | |
|---|---|
| *H01L 21/67* | (2006.01) |
| *H01L 21/311* | (2006.01) |
| *H01J 37/32* | (2006.01) |
| *H01L 21/02* | (2006.01) |
| *H01L 21/033* | (2006.01) |
| *H01L 21/3105* | (2006.01) |

(52) U.S. Cl.
CPC .. *H01J 37/32449* (2013.01); *H01L 21/02115* (2013.01); *H01L 21/02164* (2013.01); *H01L 21/02274* (2013.01); *H01L 21/0337* (2013.01); *H01L 21/0338* (2013.01); *H01L 21/311* (2013.01); *H01L 21/31055* (2013.01); *H01L 21/31111* (2013.01); *H01L 21/31116* (2013.01); *H01L 21/31122* (2013.01); *H01L 21/31138* (2013.01); *H01J 2237/334* (2013.01)

(58) Field of Classification Search
CPC ........... H01J 37/32137; H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 4,274,841 | A | 6/1981 | Andersen et al. |
| 4,668,261 | A | 5/1987 | Chatzipetros et al. |
| 4,673,589 | A | 6/1987 | Standley |
| 4,863,493 | A | 9/1989 | Kotani et al. |
| 4,863,760 | A | 9/1989 | Schantz et al. |
| 4,975,144 | A | 12/1990 | Yamazaki et al. |
| 5,222,549 | A | 6/1993 | Ishii et al. |
| 5,231,057 | A | 7/1993 | Doki et al. |
| 5,261,250 | A | 11/1993 | Missimer |
| 5,378,316 | A | 1/1995 | Franke et al. |
| 5,470,661 | A | 11/1995 | Bailey et al. |
| 5,562,952 | A | 10/1996 | Nakahigashi et al. |
| 5,670,066 | A | 9/1997 | Barnes et al. |
| 5,792,269 | A | 8/1998 | Deacon et al. |
| 5,900,288 | A | 5/1999 | Kuhman et al. |
| 5,981,398 | A * | 11/1999 | Tsai .................. H01L 21/32136 257/E21.311 |
| 5,985,103 | A | 11/1999 | Givens et al. |
| 6,006,797 | A | 12/1999 | Bulow et al. |
| 6,030,591 | A | 2/2000 | Tom et al. |
| 6,030,881 | A | 2/2000 | Papasouliotis et al. |
| 6,035,803 | A | 3/2000 | Robles et al. |
| 6,041,734 | A | 3/2000 | Raoux et al. |
| 6,066,209 | A | 5/2000 | Sajoto et al. |
| 6,150,719 | A | 11/2000 | Saia et al. |
| 6,215,087 | B1 | 4/2001 | Akahori et al. |
| 6,241,793 | B1 | 6/2001 | Lee et al. |
| 6,286,321 | B1 | 9/2001 | Glater |
| 6,319,299 | B1 | 11/2001 | Shih et al. |
| 6,331,480 | B1 | 12/2001 | Tsai et al. |
| 6,367,413 | B1 | 4/2002 | Sill et al. |
| 6,387,819 | B1 | 5/2002 | Yu |
| 6,448,186 | B1 | 9/2002 | Olson et al. |
| 6,458,516 | B1 | 10/2002 | Ye et al. |
| 6,465,051 | B1 | 10/2002 | Sahin et al. |
| 6,478,924 | B1 | 11/2002 | Shamouilian et al. |
| 6,541,397 | B1 | 4/2003 | Bencher |
| 6,573,030 | B1 | 6/2003 | Fairbairn et al. |
| 6,613,434 | B1 | 9/2003 | Drevillon et al. |
| 6,617,553 | B2 | 9/2003 | Ho et al. |
| 6,624,064 | B1 | 9/2003 | Sahin et al. |
| 6,635,185 | B2 | 10/2003 | Demmin |
| 6,777,349 | B2 | 8/2004 | Fu et al. |
| 6,787,452 | B2 | 9/2004 | Sudijono et al. |
| 6,787,819 | B2 | 9/2004 | Rhodes et al. |
| 6,967,072 | B2 | 11/2005 | Latchford et al. |
| 7,064,078 | B2 | 6/2006 | Liu et al. |
| 7,202,176 | B1 | 4/2007 | Goto et al. |
| 7,205,228 | B2 | 4/2007 | Padhi et al. |
| 7,220,982 | B2 | 5/2007 | Campbell |
| 7,223,526 | B2 | 5/2007 | Fairbairn et al. |
| 7,235,478 | B2 | 6/2007 | Geng et al. |
| 7,256,139 | B2 | 8/2007 | Moghadam et al. |
| 7,288,484 | B1 | 10/2007 | Goto et al. |
| 7,314,506 | B2 | 1/2008 | Vininski et al. |
| 7,323,401 | B2 | 1/2008 | Ramaswamy et al. |
| 7,381,644 | B1 | 6/2008 | Subramonium et al. |
| 7,399,712 | B1 | 7/2008 | Graff |
| 7,495,984 | B2 | 2/2009 | Kim et al. |
| 7,576,009 | B2 | 8/2009 | Lee et al. |
| 7,803,715 | B1 | 9/2010 | Haimson et al. |
| 7,820,556 | B2 | 10/2010 | Hsu et al. |
| 7,915,166 | B1 | 3/2011 | Yu et al. |
| 7,955,990 | B2 | 6/2011 | Henri et al. |
| 7,981,777 | B1 | 7/2011 | Subramonium et al. |
| 7,981,810 | B1 | 7/2011 | Subramonium et al. |
| 8,110,493 | B1 | 2/2012 | Subramonium et al. |
| 8,114,782 | B2 | 2/2012 | Graff |
| 8,129,281 | B1 | 3/2012 | Cheung et al. |
| 8,227,352 | B2 | 7/2012 | Yu et al. |
| 8,309,473 | B2 | 11/2012 | Hsu et al. |
| 8,435,608 | B1 | 5/2013 | Subramonium et al. |
| 8,563,414 | B1 | 10/2013 | Fox et al. |
| 8,569,179 | B2 | 10/2013 | Graff |
| 8,664,124 | B2 | 3/2014 | Graff |
| 8,669,181 | B1 | 3/2014 | Yu et al. |
| 9,023,731 | B2 | 5/2015 | Ji et al. |
| 9,362,133 | B2 | 6/2016 | Shamma et al. |
| 2001/0021491 | A1 | 9/2001 | Chen et al. |
| 2002/0132101 | A1 | 9/2002 | Fonash et al. |
| 2002/0182848 | A1 | 12/2002 | Joseph et al. |
| 2003/0044532 | A1 | 3/2003 | Lee et al. |
| 2003/0106647 | A1 | 6/2003 | Koshiishi et al. |
| 2004/0000534 | A1 | 1/2004 | Lipinski |
| 2004/0016972 | A1 | 1/2004 | Singh et al. |
| 2004/0018750 | A1 | 1/2004 | Sophie et al. |
| 2004/0023502 | A1 | 2/2004 | Tzou et al. |
| 2004/0025791 | A1 * | 2/2004 | Chen .................... H01J 37/321 118/728 |
| 2004/0140506 | A1 | 7/2004 | Singh et al. |
| 2004/0180551 | A1 | 9/2004 | Biles et al. |
| 2004/0224504 | A1 | 11/2004 | Gadgil |
| 2004/0266195 | A1 | 12/2004 | Dokumaci et al. |
| 2005/0042889 | A1 | 2/2005 | Lee et al. |
| 2005/0054202 | A1 | 3/2005 | Pan et al. |
| 2005/0098119 | A1 | 5/2005 | Burger et al. |
| 2005/0112506 | A1 | 5/2005 | Czech et al. |
| 2005/0129935 | A1 | 6/2005 | Kunitake et al. |
| 2005/0130404 | A1 | 6/2005 | Moghadam et al. |
| 2005/0167394 | A1 | 8/2005 | Liu et al. |
| 2005/0202683 | A1 | 9/2005 | Wang et al. |
| 2005/0260411 | A1 | 11/2005 | Ravi |
| 2005/0287771 | A1 | 12/2005 | Seamons et al. |
| 2006/0019486 | A1 | 1/2006 | Yu et al. |
| 2006/0091559 | A1 | 5/2006 | Nguyen et al. |
| 2006/0154086 | A1 | 7/2006 | Fuller et al. |
| 2006/0154477 | A1 | 7/2006 | Geng et al. |
| 2006/0197881 | A1 | 9/2006 | Kang et al. |
| 2006/0205223 | A1 | 9/2006 | Smayling |
| 2006/0231524 | A1 | 10/2006 | Liu et al. |
| 2007/0032054 | A1 | 2/2007 | Ramaswamy et al. |
| 2007/0048674 | A1 | 3/2007 | Wells |
| 2007/0054500 | A1 | 3/2007 | Bencher |
| 2007/0059913 | A1 | 3/2007 | King et al. |
| 2007/0077780 | A1 | 4/2007 | Wang et al. |
| 2007/0105303 | A1 | 5/2007 | Busch et al. |
| 2007/0125762 | A1 | 6/2007 | Cui et al. |
| 2007/0128538 | A1 | 6/2007 | Fairbairn et al. |
| 2007/0140029 | A1 | 6/2007 | Kim et al. |

(56) References Cited

U.S. PATENT DOCUMENTS

| | | |
|---|---|---|
| 2007/0166546 A1 | 7/2007 | Ichikawa et al. |
| 2007/0166979 A1 | 7/2007 | Wang et al. |
| 2007/0202640 A1 | 8/2007 | Al-Bayati et al. |
| 2007/0225823 A1 | 9/2007 | Hawkins et al. |
| 2007/0247073 A1 | 10/2007 | Paterson et al. |
| 2008/0057666 A1 | 3/2008 | Kim |
| 2008/0073636 A1 | 3/2008 | Kim |
| 2008/0083916 A1 | 4/2008 | Kim |
| 2008/0128907 A1 | 6/2008 | Yang et al. |
| 2008/0200003 A1 | 8/2008 | Hong et al. |
| 2008/0242912 A1 | 10/2008 | Letessier et al. |
| 2008/0254639 A1 | 10/2008 | Graff |
| 2008/0254641 A1 | 10/2008 | Kobayashi et al. |
| 2008/0264803 A1 | 10/2008 | Agrawal |
| 2009/0182180 A1 | 7/2009 | Huang et al. |
| 2009/0305516 A1 | 12/2009 | Hsu et al. |
| 2010/0144150 A1* | 6/2010 | Sills ............... H01L 21/0273 438/694 |
| 2010/0151691 A1 | 6/2010 | Henri et al. |
| 2010/0297853 A1 | 11/2010 | Hsu et al. |
| 2010/0311251 A1 | 12/2010 | Okada et al. |
| 2011/0151678 A1 | 6/2011 | Ashtiani et al. |
| 2011/0244142 A1 | 10/2011 | Cheng et al. |
| 2012/0149207 A1 | 6/2012 | Graff |
| 2012/0196446 A1 | 8/2012 | Graff |
| 2012/0202301 A1 | 8/2012 | Yaegashi |
| 2012/0329268 A1 | 12/2012 | Soda et al. |
| 2013/0119406 A1 | 5/2013 | Notsu et al. |
| 2013/0122686 A1 | 5/2013 | Chang et al. |
| 2014/0054534 A1 | 2/2014 | Pellizzer et al. |
| 2014/0057454 A1 | 2/2014 | Subramonium et al. |
| 2014/0094035 A1 | 4/2014 | Ji et al. |
| 2014/0170853 A1 | 6/2014 | Shamma et al. |
| 2016/0314964 A1 | 10/2016 | Tang et al. |

FOREIGN PATENT DOCUMENTS

| | | |
|---|---|---|
| CN | 101065834 A | 10/2007 |
| CN | 102187450 A | 9/2011 |
| CN | 102468434 A | 5/2012 |
| CN | 102652353 A | 8/2012 |
| FR | 2853313 | 10/2004 |
| JP | 62019539 | 1/1987 |
| JP | 08-152262 | 6/1996 |
| SU | 382671 | 10/1973 |
| TW | 201123294 A | 7/2011 |
| WO | WO 2005/048367 | 5/2005 |
| WO | WO 2010/020578 A1 | 2/2010 |

OTHER PUBLICATIONS

U.S. Notice of Allowance, dated Jan. 9, 2015, issued in U.S. Appl. No. 13/896,729.
U.S. Notice of Allowance (Corrected Notice of Allowability), dated Apr. 24, 2015, issued in U.S. Appl. No. 13/896,729.
U.S. Office Action, dated Aug. 4, 2015, issued in U.S. Appl. No. 14/101,901.
U.S. Final Office Action, dated Nov. 25, 2015, issued in U.S. Appl. No. 14/101,901.
U.S. Notice of Allowance, dated Feb. 10, 2016, issued in U.S. Appl. No. 14/101,901.
"Novellus Systems Introduces Ashable Hard Mask Process Technology on Vector Express Platform," Novellus Press Release, Jun. 25, 2007, *Novellus Systems, Inc.*, San Jose, California, *LamResearch*, 2pp.
U.S. Appl. No. 14/185,757, filed Feb. 20, 2014, entitled "PECVD Films for EUV Lithography."
U.S. Appl. No. 14/270,001, filed May 5, 2014, entitled "Sulfur Doped Carbon Hard Masks."
U.S. Appl. No. 14/248,046, filed Apr. 8, 2014, entitled High Selectivity and Low Stress Carbon Hardmask by Pulsed Low Frequency RF Power.
U.S. Appl. No. 13/160,399, filed Jun. 14, 2011, entitled "Methods of Depositing Highly Selective Transparent Ashable Hardmask Films".
U.S. Appl. No. 11/612,382, filed Dec. 18, 2006, entitled "Methods of Improving Ashable Hardmask Adhesion to Metal layers".
U.S. Appl. No. 11/849,208, filed Aug. 31, 2007, entitled "Methods and Apparatus for Plasma-Based Deposition".
U.S. Appl. No. 13/856,364, filed Apr. 3, 2013, entitled "Methods of Depositing Smooth and Conformal Ashable Hard Mask Films".
U.S. Notice of Allowance, dated Oct. 4, 2006, issued in U.S. Appl. No. 11/318,269.
U.S. Office Action, dated Dec. 14, 2006, issued in U.S. Appl. No. 11/318,269.
U.S. Notice of Allowance, dated May 7, 2007, issued in U.S. Appl. No. 11/318,269.
U.S. Office Action, dated Aug. 27, 2007, issued in U.S. Appl. No. 11/318,269.
U.S. Notice of Allowance, dated Jan. 7, 2008, issued in U.S. Appl. No. 11/318,269.
U.S. Office Action, dated Nov. 22, 2010, issued in U.S. Appl. No. 12/048,967.
U.S. Office Action, dated Apr. 18, 2011, issued in U.S. Appl. No. 12/048,967.
U.S. Notice of Allowance, dated Oct. 7, 2011, issued in U.S. Appl. No. 12/048,967.
U.S. Office Action dated, Dec. 27, 2007, issued in U.S. Appl. No. 11/449,983.
U.S. Final Office Action, dated Jul. 9, 2008, issued in U.S. Appl. No. 11/449,983.
U.S. Office Action, dated Jan. 5, 2009, issued in U.S. Appl. No. 11/449,983.
U.S. Final Office Action, dated Sep. 15, 2009, issued in U.S. Appl. No. 11/449,983.
U.S. Office Action, dated Jun. 21, 2010, issued in U.S. Appl. No. 11/449,983.
U.S. Final Office Action, dated Dec. 30, 2010, issued in U.S. Appl. No. 11/449,983.
U.S. Notice of Allowance, dated Mar. 16, 2011, issued in U.S. Appl. No. 11/449,983.
U.S. Office Action, dated Jun. 1, 2007, issued in U.S. Appl. No. 11/612,382.
U.S. Office Action, dated Oct. 9, 2007, issued in U.S. Appl. No. 11/612,382.
U.S. Final Office Action, dated May 13, 2008, issued in U.S. Appl. No. 11/612,382.
U.S. Office Action, dated Aug. 19, 2008, issued in U.S. Appl. No. 11/612,382.
U.S. Final Office Action, dated Feb. 24, 2009, issued in U.S. Appl. No. 11/612,382.
U.S. Final Office Action, dated May 12, 2009, issued in U.S. Appl. No. 11/612,382.
U.S. Final Office Action, dated Dec. 9, 2009, issued in U.S. Appl. No. 11/612,382.
U.S. Office Action, dated Mar. 26, 2010, issued in U.S. Appl. No. 11/612,382.
U.S. Office Action dated Nov. 20, 2009, issued in U.S. Appl. No. 11/710,652.
U.S. Final Office Action dated Apr. 15, 2010, issued in U.S. Appl. No. 11/710,652.
U.S. Office Action dated Aug. 5, 2010, issued in U.S. Appl. No. 11/710,652.
U.S. Notice of Allowance dated Nov. 24, 2010, issued in U.S. Appl. No. 11/710,652.
U.S. Office Action dated Jul. 9, 2013, issued in U.S. Appl. No. 13/032,392.
U.S. Notice of Allowance dated Oct. 25, 2013, issued in U.S. Appl. No. 13/032,392.
U.S. Office Action, dated Jan. 5, 2009, issued in U.S. Appl. No. 11/710,377.
U.S. Office Action, dated Aug. 19, 2009, issued in U.S. Appl. No. 11/710,377.
U.S. Office Action, dated Mar. 31, 2010, issued in U.S. Appl. No. 11/710,377.

(56) References Cited

OTHER PUBLICATIONS

U.S. Notice of Allowance, dated Mar. 22, 2011, issued in U.S. Appl. No. 11/710,377.
U.S. Office Action, dated Sep. 3, 2010, issued in U.S. Appl. No. 11/849,208.
U.S. Final Office Action, dated Apr. 12, 2011, issued in U.S. Appl. No. 11/849,208.
U.S. Final Office Action, dated Sep. 14, 2012, issued in U.S. Appl. No. 11/849,208.
U.S. Final Office Action, dated Apr. 24, 2013, issued in U.S. Appl. No. 11/849,208.
U.S. Office Action, dated Feb. 28, 2014, issued in U.S. Appl. No. 13/974,808.
U.S. Final Office Action, dated Aug. 4, 2014, issued in U.S. Appl. No. 13/974,808.
U.S. Office Action, dated Oct. 19, 2011, issued in U.S. Appl. No. 12/163,670.
U.S. Office Action, dated Feb. 14, 2012, issued in U.S. Appl. No. 12/163,670.
U.S. Office Action, dated Jul. 6, 2012, issued in U.S. Appl. No. 12/163,670.
U.S. Final Office Action dated Oct. 18, 2012, issued in U.S. Appl. No. 12/163,670.
U.S. Notice of Allowance dated Jan. 3, 2013, issued in U.S. Appl. No. 12/163,670.
U.S. Notice of Allowance, dated Nov. 2, 2010, issued in U.S. Appl. No. 12/334,220.
U.S. Supplemental Notice of Allowance, dated Feb. 8, 2011, issued in U.S. Appl. No. 12/334,220.
U.S. Office Action, dated Aug. 19, 2009, issued in U.S. Appl. No. 12/133,223.
U.S. Final Office Action, dated Dec. 21, 2009, issued in U.S. Appl. No. 12/133,223.
U.S. Notice of Allowance, dated Mar. 2, 2010, issued in U.S. Appl. No. 12/133,223.
U.S. Office Action, dated Nov. 9, 2011, issued in U.S. Appl. No. 12/786,842.
U.S. Final Office Action, dated Apr. 19, 2012, issued in U.S. Appl. No. 12/786,842.
U.S. Notice of Allowance, dated Jul. 20, 2012, issued in U.S. Appl. No. 12/786,842.
U.S. Office Action, dated Aug. 10, 2012, issued in U.S. Appl. No. 12/766,721.
U.S. Final Office Action, dated Mar. 14, 2013, issued in U.S. Appl. No. 12/766,721.
U.S. Notice of Allowance, dated Jun. 28, 2013, issued in U.S. Appl. No. 12/766,721.
U.S. Office Action, dated Jun. 1, 2007, issued in U.S. Appl. No. 11/263,148.
U.S. Final Office Action, dated Oct. 24, 2007, issued in U.S. Appl. No. 11/263,148.
U.S. Notice of Allowance, dated Mar. 18, 2008, issued in U.S. Appl. No. 11/263,148.
U.S. Office Action, dated May 2, 2011, issued in U.S. Appl. No. 11/263,148.
U.S. Notice of Allowance, dated Oct. 13, 2011, issued in U.S. Appl. No. 11/263,148.
U.S. Office Action, dated Feb. 15, 2013, issued in U.S. Appl. No. 13/371,184.
U.S. Notice of Allowance, dated Jul. 1, 2013, issued in U.S. Appl. No. 13/371,184.
U.S. Office Action, dated Oct. 9, 2013, issued in U.S. Appl. No. 13/372,363.
U.S. Notice of Allowance, dated Dec. 30, 2013, issued in U.S. Appl. No. 13/372,363.
Korean Office Action, dated Jun. 1, 2010, issued in Application No. 2009/0048358.
Callegari et al. (1993) "Optical properties of hydrogenated amorphous-carbon film for attenuated phase-shift mask applications," *J. Vac. Sci. Technol. B* 11(6):2697-2699.
Grill, A. (1999) "Diamond-like carbon: state of the art," *Diamond and Related Materials* 8,pp. 428-434.
Grill, A. (1999) "Plasma-deposited diamondlike carbon and related materials," IBM Journal of Research and Development, vol. 43, p. 147-162, http://research.ibm.com/journal/rd/431/grill.html, 14 pp.
Grill, et al. (1990) "Diamondlike carbon films by RF plasma-assisted chemical vapor deposition from acetylene," *IBM J. Res. Develop.*, 34(6):849-857.
Holmes et al. (1987) "Trimethylsilylacetylene", *Organic Syntheses, Coll.* vol. 8, p. 606; vol. 65, p. 61.
Ikeda et al. (1992) "Top-PECVD": A New Conformal Plasma Enhanced CVD Technology using TEOS, Ozone and Pulse-modulated RF Plasma, *IEEE*, pp. 11.2.1-11.2.4.
Jacobsohn et al. (1998) "Hydrogenated Carbon-Nitrogen Films Obtained by PECVD Using Acetylyne and Nitrogen as Precursor Gases," Mat. Res. Soc. Symp. Proc., 498: 283-288.
Kragler et al. (1995) "Scanning tunneling microscopy based lithography employing amorphous hydrogenated carbon as a high resolution resist mask," *Appl. Phys. Lett.* 67(8):1163-1165.
Kreupl, Franz et al. (2008) "Carbon-Based Resistive Memory," presented at *IEDM*, submitted Jun. 26, 2008; accepted Aug. 4, 2008, 4 pages.
Lemaire, P.J., Walker, K.L., Kranz, K.S., Huff, R.G. and DiMarcello, F.V. "Diffusion of Hydrogen Through Hermetic Carbon Films on Silica Fibers," AT&T Bell Laboratories, 600 Mountain Avenue, Murray Hill, NJ 07974. *Mat. Res. Soc. Symp. Proc.*, 172:85-96 © 1990 Materials Research Society.
Muhl et al. (1999) "A Review of the Preparation of Carbon Nitride Films," Diamond and Related Materials, 8: 1809-1830.
Ong, Soon-Eng et al. (2007) "Temperature effect on bonding structures of amorphous carbon containing more than 30at.% silicon," *Diamond & Related Materials*, 16:1823-1827.
Van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.
U.S. Office Action, dated Sep. 12, 2016, issued in U.S. Appl. No. 14/692,627.
U.S. Final Office Action, dated May 19, 2017, issued in U.S. Appl. No. 14/692,627.
U.S. Office Action, dated Nov. 8, 2017, issued in U.S. Appl. No. 14/692,627.
U.S. Final Office Action, dated May 16, 2018, issued in U.S. Appl. No. 14/692,627.
Taiwan Notice of Allowance and Search Report dated Jul. 13, 2017 issued in Application No. TW 102117769.
Taiwan Examination Report dated Feb. 9, 2017 issued in Application No. TW 102146185.
Chinese First Office Action dated Jun. 25, 2018 issued in Application No. CN 201610251266.2.

\* cited by examiner

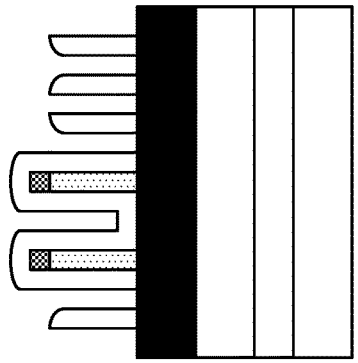
FIG. 7A
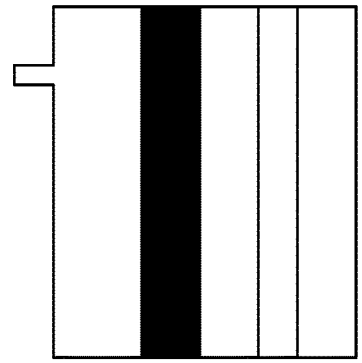
FIG. 8A
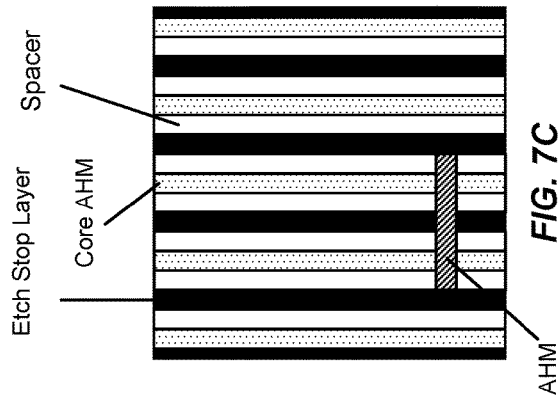
FIG. 7C
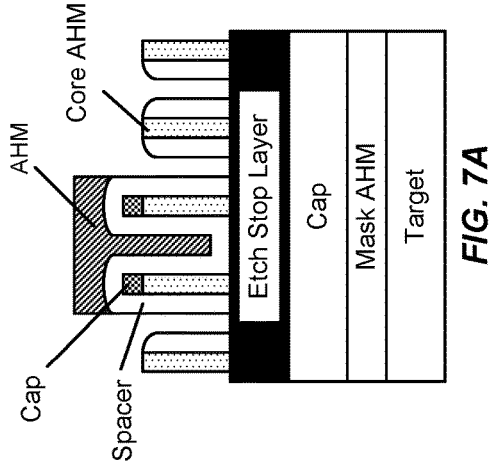
FIG. 7B
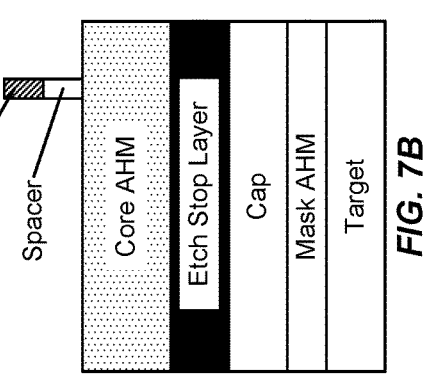
FIG. 8B
FIG. 8C

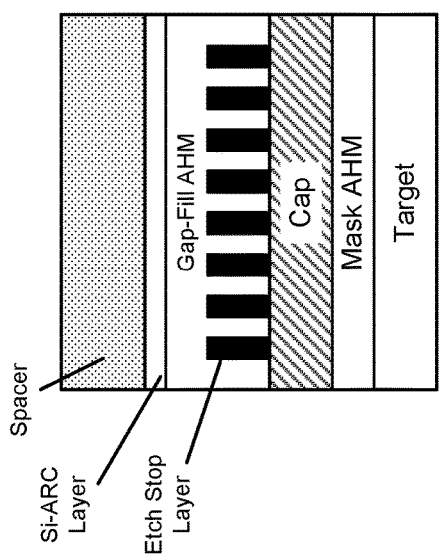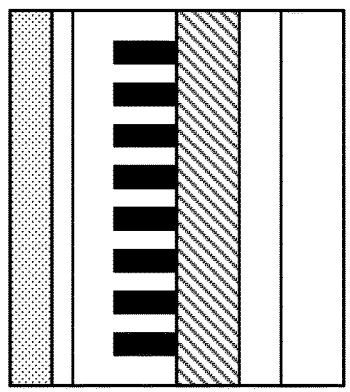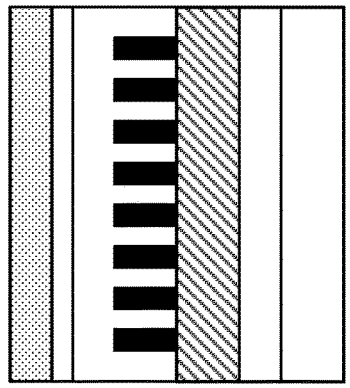
FIG. 11A    FIG. 12A    FIG. 13A
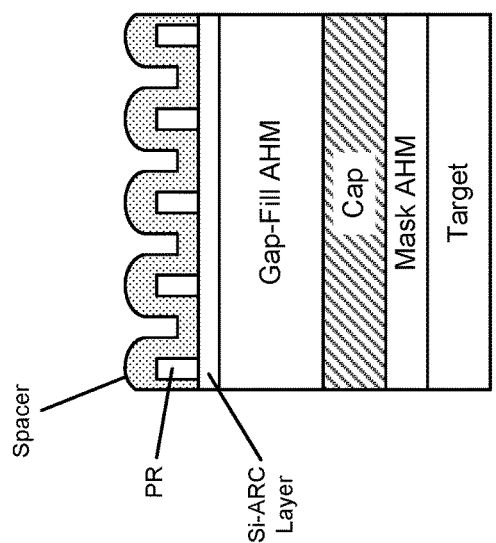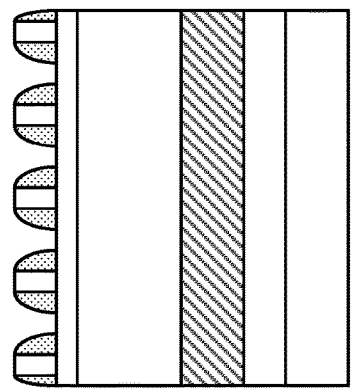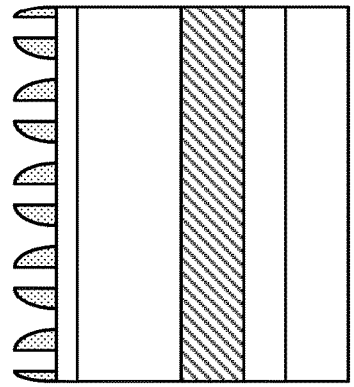
FIG. 11B    FIG. 12B    FIG. 13B

IMAGE REVERSAL WITH AHM GAP FILL FOR MULTIPLE PATTERNING

CROSS-REFERENCE TO RELATED APPLICATION

This application is a divisional of U.S. patent application Ser. No. 14/101,901, filed on Dec. 10, 2013, entitled "METHOD FOR FORMING A MASK BY ETCHING CONFORMAL FILM ON PATTERNED ASHABLE HARDMASK," which claims benefit of U.S. Provisional Patent Application No. 61/737,688, filed on Dec. 14, 2012, and titled "IMAGE REVERSAL WITH AHM GAP FILL FOR MULTIPLE PATTERNING," which is incorporated by reference herein in its entirety and for all purposes.

BACKGROUND

Patterning methods are critical to semiconductor processing. In particular, double patterning has been used to extend lithographic technology beyond its optical limits. Image reversal methods have been used to perform double patterning to reduce the number of masking steps involved in semiconductor device fabrication. Methods of double patterning, particularly line patterning, in both positive and negative double patterning processes have involved the use of spacers and masks. Current methods provide poor, unstable and weak masks that are unable to provide effective formation of high aspect ratio features in semiconductors. Methods that reduce process operations are also preferred for increased efficiency and throughput.

SUMMARY

In one aspect, a method of processing a semiconductor substrate is provided. The method may involve transferring a pattern from an overlying photoresist to a core ashable hardmask (AHM) layer; depositing a conformal film over the patterned core AHM layer on the substrate; depositing a gap-fill AHM layer over the conformal film; planarizing the substrate with a process that etches both the conformal film and the gap-fill AHM layer to remove the conformal film overlying the core AHM layer; and selectively etching the conformal film to form a mask.

In some embodiments, the substrate is planarized by flowing oxygen ($O_2$) and helium (He) at about 20 sccm and about 200 sccm, respectively, for about 30 seconds. Subsequently, the substrate may be exposed to aqueous hydrofluoric acid solution including 1000 parts deionized (DI) water to 1 part anhydrous HF by volume, for about 30 seconds. The substrate may also undergo a two-step plasma etch process by flowing $CF_4$ and Ar at about 5 sccm and about 100 sccm, respectively, for 10 seconds, and flowing $CHF_3$ and $CF_4$ at about 15 sccm and about 80 sccm, respectively, for 30 seconds. In various embodiments, the substrate is planarized at a temperature between about 10° C. and about 50° C. and a pressure between about 2 Torr and about 20 Torr. In many embodiments, the substrate is planarized using plasma etching.

In some embodiments, the pattern includes features with aspect ratios between about 1:1 and about 5:1. In various embodiments, a target layer is patterned with the mask. In some embodiments, prior to transferring a pattern from an overlying photoresist to a core AHM layer, transferring the pattern from an overlying photoresist to a bottom anti-reflective layer and cap layer simultaneously by pulsing power.

In some embodiments, the gap-fill AHM layer is deposited by (a) flowing a hydrocarbon using plasma enhanced chemical vapor deposition until a gap entry width between features in the pattern is reduced, (b) anisotropically etching the substrate with a dominant anisotropic axis substantially perpendicular to the substrate, (c) repeating X cycles of (a) and (b), wherein X is a positive integer, and (d) ashing the substrate to remove localized build-up of carbon film on the surface. In some embodiments, the hydrocarbon is methane, acetylene, or propylene.

In another aspect, a method of processing a semiconductor substrate may involve transferring a pattern from a overlying first photoresist to a core first ashable hardmask (AHM) layer in a first dimension; depositing a first conformal film over the patterned core first AHM layer on the substrate; depositing a second AHM layer over the first conformal film; selectively etching the second AHM layer and the core first AHM layer to expose the patterned first conformal film; etching an underlying etch stop layer using the patterned first conformal film; depositing a gap-fill third AHM layer; depositing and lithographically defining a second photoresist in a second dimension; depositing a second conformal film over the second patterned photoresist; selectively etching the second conformal film to expose the second patterned photoresist; selectively etching the second patterned photoresist; selectively etching the gap-fill third AHM layer; and selectively etching an underlying cap layer to form a two-dimensional mask.

In some embodiments, the method also involves depositing and lithographically defining a third photoresist layer on the second AHM layer to form a block mask; and selectively etching the second AHM layer using the block mask. In some embodiments, the method also involves patterning a target layer with the two-dimensional mask.

In some embodiments, depositing the gap-fill third AHM layer further involves (a) flowing a hydrocarbon using plasma enhanced chemical vapor deposition until a gap entry width between features in the pattern is reduced, (b) anisotropically etching the substrate with a dominant anisotropic axis substantially perpendicular to the substrate, (c) repeating X cycles of (a) and (b), wherein X is a positive integer, and (d) ashing the substrate to remove localized build-up of carbon film on the surface. In some embodiments, the hydrocarbon is methane, acetylene, or propylene.

In various embodiments, the second pattern further includes features with aspect ratios between about 1:1 and about 5:1. In some embodiments, the second conformal film is deposited at a temperature less than about 80° C.

Another aspect involves a semiconductor processing tool that includes: one or more process chambers; one or more gas inlets into the one or more process chambers and associated flow-control hardware; a low frequency radio frequency (LFRF) generator; a high frequency radio frequency (HFRF) generator; and a controller having at least one processor and a memory. In various embodiments, the at least one processor and the memory are communicatively connected with one another, the at least one processor is at least operatively connected with the flow-control hardware, the LFRF generator, and the HFRF generator, and the memory stores computer-executable instructions. In many embodiments, the computer-executable instructions may be for controlling the at least one processor to at least control the flow-control hardware, the HFRF generator, and the LFRF generator to: etch a substrate to transfer a pattern from an overlying photoresist to a core ashable hardmask (AHM) layer; deposit a conformal film over the patterned core AHM layer on the substrate; deposit a gap-fill AHM layer over the conformal film; planarize the substrate using a planarization process that etches both the conformal film and the gap-fill AHM layer to remove the conformal film overlying the core AHM layer; and etch the conformal film selectively to form a mask.

In some embodiments, the computer-executable instructions further includes instructions for flowing oxygen ($O_2$) and helium (He) at about 20 sccm and about 200 sccm respectively in the planarization process. In various embodiments, the computer-executable instructions for depositing a gap-fill AHM layer further includes instructions for: (a) flowing a hydrocarbon using plasma enhanced chemical vapor deposition until a gap entry width between features in the pattern is reduced, (b) anisotropically etching the substrate with a dominant anisotropic axis substantially perpendicular to the substrate, (c) repeating X cycles of (a) and (b), wherein X is a positive integer, and (d) ashing the substrate to remove localized build-up of carbon film on the surface.

Another aspect involves a semiconductor processing tool with one or more process chambers; one or more gas inlets into the process chambers and associated flow-control hardware; a low frequency radio frequency (LFRF) generator; a high frequency radio frequency (HFRF) generator; and a controller having at least one processor and a memory. In various embodiments, the at least one processor and the memory are communicatively connected with one another, the at least one processor is at least operatively connected with the flow-control hardware, the LFRF generator, and the HFRF generator, and the memory stores computer-executable instructions for controlling the at least one processor to at least control the flow-control hardware, the HFRF generator, and the LFRF generator to: etch a substrate in a first dimension to transfer a pattern from a first overlying photoresist to a core first ashable hardmask (AHM) layer; flow first conformal film material on the substrate to form a first conformal film over the patterned core first AHM layer; flow a first hydrocarbon to deposit a gap-fill second AHM layer over the first conformal film; etch the second AHM layer and first AHM layer to expose the patterned first conformal film; etch an underlying etch stop layer; flow a second hydrocarbon to deposit a third AHM layer over the etch stop layer; deposit and lithographically define a second photoresist in a second dimension on the third AHM layer; flow second conformal film material to form a second conformal film on the second patterned photoresist; etch the second conformal film to expose the second patterned photoresist; etch the third AHM layer selectively; and etch an underlying cap layer to form a two-dimensional mask.

In various embodiments, the computer-executable instructions also control the at least one processor to at least control the flow-control hardware, the HFRF generator, and the LFRF generator to: deposit and lithographically define a third photoresist on the second AHM layer to form a block mask and etch the second AHM layer selectively using the block mask.

In many embodiments, the computer-executable instructions for flowing a hydrocarbon to deposit a third AHM layer further includes instructions for: (a) flowing a hydrocarbon using plasma enhanced chemical vapor deposition until a gap entry width between features in the pattern is reduced, (b) anisotropically etching the substrate with a dominant anisotropic axis substantially perpendicular to the substrate, (c) repeating X cycles of (a) and (b), wherein X is a positive integer, and (d) ashing the substrate to remove localized build-up of carbon film on the surface.

These and other aspects are described further below with reference to the drawings.

BRIEF DESCRIPTION OF THE DRAWINGS

FIGS. 2A-15A show examples of schematic illustrations of a front view of a multi-layer stack patterned by a process in accordance with disclosed embodiments.

FIGS. 2B-15B show examples of schematic illustrations of a side view of a multi-layer stack patterned by a process in accordance with disclosed embodiments.

FIGS. 7C-9C and 14C-15C show examples of schematic illustrations of a top view of a multi-layer stack patterned by a process in accordance with disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Double patterning is a key technology to extend any lithographic technology beyond its optical limits and is now widely used in the industry for any pitches less than about 80 nm. Current double patterning technologies often use sidewall spacers with two masking steps to pattern trenches. However, for line patterning, the line mask often has the wrong polarity to simultaneously pattern wide features. As a result, a third masking step is often needed to pattern the wide features, resulting in an additional masking step. Using more masking steps results in an overall more costly and less efficient method of patterning.

Image reversal has been proposed to avoid a third masking step. However, conventional image reversal schemes present various difficulties. For instance, some spin-on films have been proposed, but are weaker and unable to maintain stable, free-standing structures. Such films may also destroy small features, such as sidewall spacers, due to capillary action and other mechanical effects. These materials also often do not have the required patterning selectivity for advanced nodes. Moreover, some conventional methods may result in structures with gaps or voids in the deposited gap-fill layer, thereby weakening its ability to be used as a mask or for use in patterning steps.

Provided herein are methods to perform double patterning and image reversal patterning by eliminating steps using ashable hardmasks (AHMs) deposited by a deposition-etchash method. These methods eliminate steps in the double patterning process, thereby increasing efficiency and decreasing cost of patterning semiconductor devices. Moreover, such methods result in durable, robust masks especially for small, high aspect ratio features which can be tailored for any line critical dimension and can be effectively used in both single dimension and two-dimension patterning, as well as triple or quadruple patterning processes.

Image Reversal Double Patterning with Robust Mask and Reduced Etch Steps

Figure 1A:
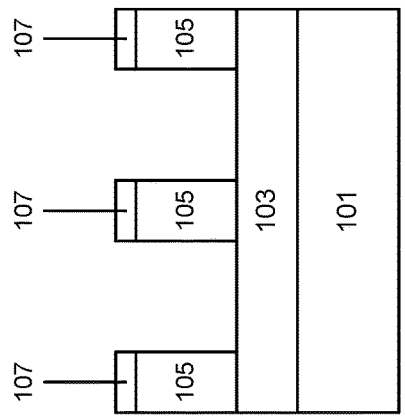
FIG. 1A-1F shows schematic illustrations of a patterning process of a multi-layer stack in accordance with disclosed embodiments.

Methods provided herein begin with a multi-layer stack prepared for patterning. Such a stack may be a wafer suitable for semiconductor processing. FIG. 1A provides a schematic illustration of an example of various layers that may be included in a multi-layer stack. The multi-layer stack in FIG. 1A includes a target layer 101, which may be the layer to ultimately be patterned. A target layer may be a semiconductor, dielectric or other layer and may be made of silicon (Si), silicon oxide ($SiO_2$), silicon nitride (SiN), or titanium nitride (TiN), for example, and may be deposited by atomic layer deposition (ALD), chemical vapor deposition (CVD), or other suitable deposition techniques.

The layer on top of target layer 101 is an optional etch stop layer 103. An etch stop layer may be used to protect the target layer while the mask is formed in the layers above. An etch stop layer may include silicon, such as silicon nitride or amorphous silicon.

The layer on top of etch stop layer 103 is a core layer 105. The core layer 105 may be an AHM. AHMs may be amorphous carbon material, which may be highly etch selective to other materials in the stack, such as silicon and/or silicon-based oxides or nitrides, for example, and transparent. An AHM may be deposited on the etch stop layer 103 by plasma enhanced CVD (PECVD), which may involve generating a plasma in the deposition chamber from deposition gases including a hydrocarbon precursor. In various embodiments, the hydrocarbon precursor may be defined by the formula $C_xH_y$, where x is an integer between 2 and 10, and y is an integer between 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). A dual radio frequency (RF) plasma source including a high frequency (HF) power and a low frequency (LF) power may be used.

On top of core 105 is an optional cap layer 107. The cap layer 107 may be made of dielectric material, such as a silicon-rich oxide ($SiO_2$, $SiO_x$, etc.), silicon oxynitride ($SiO_xN_y$), silicon nitride (SiN), amorphous silicon (a-Si), or tetraethyl orthosilicate ($Si(OC_2H_5)_4$ or TEOS). The cap layer 107 may be made of a nitrogen-containing compound (such as SiN) or may be nitrogen-free (such as $SiO_2$). In some embodiments, the cap layer 107 may be a nitrogen-free anti-reflective coating layer (NFARL).

On top of cap layer 107 is an optional bottom anti-reflective coating (BARC) layer 109. The BARC layer may be made of polymeric material ($C_xH_yO_z$) and may be deposited by spin-on methods.

On top of the BARC layer 109 is a photoresist layer 111, which may be lithographically patterned.

The process provided herein eliminates a conformal film etching step, thereby eliminating a step and increasing efficiency in patterning schemes. The process shown by schematic illustrations in FIGS. 1A-1F provide a general depiction of an embodiment.

In FIG. 1A, a photoresist 111 of a multi-layer film stack is patterned. Patterning a photoresist may be done by any conventional lithography method in any lithography apparatus, such as a track system, for example Sokudo RF3, available from DAINIPPON SCREEN.

Figure 1B:
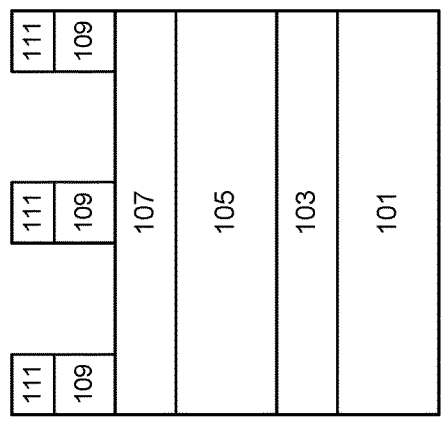

In FIG. 1B, the photoresist 111 pattern is transferred to the BARC layer 109 such that the BARC layer 109 is etched while simultaneously, the pattern is trimmed. In this one-step process, an anisotropic etch is performed to etch the pattern to the BARC layer 109 while an isotropic dry etch is performed to trim the pattern using power pulsing in some embodiments. For example, in some embodiments, a $CF_x$ compound such as $CF_4$ and power may be pulsed alternately at a frequency of about 200 Hz. The flow rate of $CF_4$ may be between about 50 sccm and about 200 sccm. Other gases that may be pulsed in this step include helium (He).

Figure 1C:
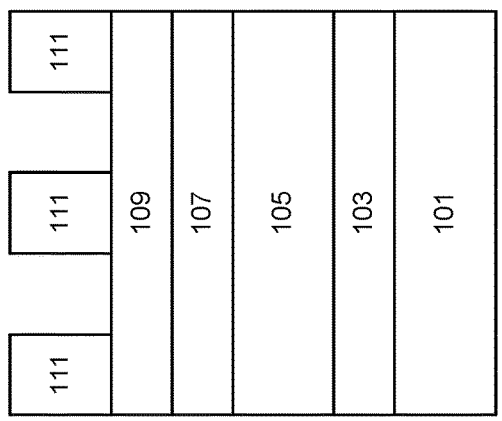

In FIG. 1C, the pattern is further transferred to the core layer 105, and both the photoresist 111 and the BARC layer 109 are removed. Note in this process that the optional cap 107 which has been patterned may have a diminished thickness. This pattern transfer may be etched by, for example, plasma etching using sulfur hexafluoride ($SF_6$) and $C_xF_yH_z$ at a pressure of about 10 mTorr and a temperature of about 30° C. The photoresist 111 and the BARC layer 109 may be removed by oxygen ($O_2$) and helium (He) during core AHM etching.

Figure 1D:
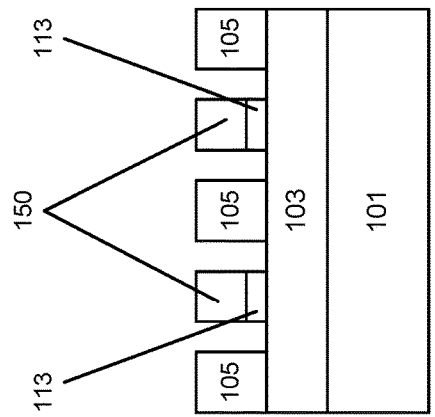

In FIG. 1D, a conformal layer 113 is deposited on top of the cap layer 107. The conformal layer 113 may also be referred to as a "spacer" and may be deposited to conform to the shape of the pattern on the multi-layer stack to make an evenly distributed layer over the pattern.

In some embodiments, the conformal layer 113 is a made of dielectric material, such as $SiO_2$. The conformal layer 113 may be an oxide or silicon nitride (SiN). The spacer may be deposited by ALD, PEALD, PECVD, or other suitable deposition methods in a deposition apparatus. The following conditions are examples of conditions suitable for depositing a silicon oxide conformal layer by a PEALD process: The temperature may be between about 50° C. and 400° C., for example about 50° C.; the pressure may be between about 0.5 Torr and about 10 Torr, for example about 2-3 Torr; RF power, for four 300 mm wafers, may be between about 100 and 2500 W, for example about 500-600 W, so as not to damage substrate. The process gases that may be used include, as a silicon source, a silicon amide (e.g., BTBAS—bis-t-butyl aminosilane, BDEAS (bis-di-ethyl aminosilane) or DIPAS (di-isopropyl aminosilane), and, as an oxygen source, oxygen or nitrous oxide, separately or together, diluted with an inert carrier gas, for example argon or nitrogen. Process gas flow rates may be as follows: for (liquid) silicon precursor (BTBAS, BDEAS, DIPAS), between about 1 and 3 ccm, for example BTBAS at about 2.5 ccm; for oxygen precursor ($O_2$, $N_2O$), between about 5000 sccm and 10,000 sccm, for example $N_2O$ at 5000 sccm; and for the carrier gas (Ar or $N_2$), between about 0 and 10,000 sccm, for example about 5000 Ar. The conformal layer has a high etch selectivity to the core.

Also during this step, in FIG. 1D, a gap-fill AHM layer 150 is deposited on top of the conformal layer 113. The gap-fill AHM layer 150 may be deposited using a deposition-etch-ash technique.

Such a technique may be conducted on a PECVD platform that allows for filling of high aspect ratio features, e.g., having aspect ratios up to 12:1 and gap width of 30 nm or less, by amorphous carbon material with reduced or minimal voids as compared to other PECVD techniques.

An alternated ((Deposition+Etching)$_X$+Ashing)$_Y$ process may be implemented on a PECVD platform to deposit the gap-fill AHM 150 onto the substrate having gap features defined by the pattern on the conformal layer 113. Variables "X" and "Y" as used herein may refer to process cycle repetitions which are the number of respective process cycles that are performed, as opposed to the "x" and "y" used with reference to FIG. 1A and core layer 105 as integers for hydrocarbon variations. Deposition into the trench may be conducted until the trench opening is reduced, e.g., closed or narrowed to the point that continued deposition in the trench is unacceptably slowed due to top deposition. Then, the process may be switched to an anisotropic etch process, and then an ashing process. General process operations of this technique may include, for example: (1) a PECVD deposition step in which carbon film is deposited into a gap feature until deposition in the gap is unacceptably slowed or stopped due to closing of the entry to a gap feature by deposited carbon at the top of the gap, (2) a high ion sputtering step, in which carbon film is removed from a gap entry by an etch chemistry that includes $H_2$ and Ar to reopen the gap for further film deposition, and (3) a third step in which the etch process conditions are adjusted to effect an ash process that is used to preferentially remove carbon accumulation on the top of the substrate surface adjacent to the gap entry, commonly referred to as "top hats." Both the deposition and high ion sputtering steps may be repeated for several cycles before the etch step, and after the etch step, deposition and high ion sputtering steps may be repeated again to incrementally fill the gaps defined by the pattern of the conformal layer 113. These alternating steps may be performed in one process path without a vacuum break. A chemical-physical combined etch may be used to preferentially remove film deposited at the trench top, but with less etching of the film deposited in the trench.

The gap-fill AHM may be deposited using a PECVD process. In this regard, the deposition step may involve flowing a process gas with a precursor into the chamber to deposit gap-fill AHM layer 150. Any suitable hydrocarbon precursor, such as are used in amorphous carbon and AHM deposition processes, may be used, such as acetylene ($C_2H_2$). The process gas may include only one type of hydrocarbon precursor. Other process gases may include hydrogen, nitrogen, helium, argon, or other inert gases. A plasma may be ignited in these process gases using a radio frequency (RF) source and a carbon film 150 may then be deposited in the gap by the resulting PECVD process.

The deposition process may be conducted until the trench opening is closed or narrowed to the point that continued deposition in the trench is unacceptably slowed due to top deposition. For example, the deposition rate for a deposition cycle may be unacceptably slowed when the deposition rate decreases to approximately 40% to 60% of the deposition rate at the start of the deposition cycle. In other implementations, there may be more or less decrease in deposition rate.

An anisotropic etch may be performed to remove deposited carbon film at the gap entry. The anisotropic etch operation may be a plasma etch featuring a high ion sputtering regime in which carbon film is removed from the gap entry by an etch chemistry that includes hydrogen ($H_2$) and argon (Ar), thus reopening the gap for further film deposition. The reopened gap allows for further gap fill of the gap feature to form a void-free gap-fill AHM layer 150. The etch operation may be performed for a given duration, e.g., a duration that is associated with sufficient carbon film removal to cause the gap to generally be reopened to the point where the gap entry is slightly undercut. In some implementations, the etch operation may be performed until the carbon film on the top surface is completely or nearly completely removed and then stopped. This may prevent the etch process from also removing the material in the multi-layer stack in addition to the overlying carbon film 150.

A high ion sputtering regime may, for example, be provided by a process environment including a high flow of argon (Ar) gas, a high level of LFRF power, and a high pressure as compared to a low ion sputtering regime, which may feature argon (Ar) gas flow, a low level of LFRF power, and a low pressure.

Then the deposition and etch operations to deposit the gap-fill AHM layer 150 may be repeated a plurality of times to continue filling the gaps in the pattern. In various embodiments, these steps may be repeated between 1 and 100 times. After a number of deposition and etch cycles, accumulations at the top of each gap adjacent to the gap entry, commonly referred to as "top hat" features, form and these may be removed by conducting an ashing operation with process conditions adjusted preferentially to remove the top hat carbon accumulation on top of the surface of the substrate adjacent to each gap entry.

Deposition, etch, and ash steps to deposit the gap-fill AHM layer 150 may be repeated y times in the same or similar cycle until the gap is filled. These steps may be repeated for at least 1 cycle or between 2 and 1000 cycles, depending on the height of the gaps created by the pattern and other considerations. Thus, the process may be described by the formula $((Dep-Etch)_X+Ash)_Y$.

Suitable process parameters for deposition of the gap-fill AHM layer 150 in FIG. 1D are presented in the following tables. Table 1 provides general ranges of process parameters suitable for practicing embodiments of a carbon deposition-etch-ash gap fill process that may be used in implementations of the disclosed embodiments.

TABLE 1

General Process Parameters for Deposition of Gap-Fill AHM Layer

| Parameter | Deposition | Etch | Ash |
|---|---|---|---|
| Time (s) | 0.5-30 | 0.5-30 | 0.5-30 |
| Pressure (Torr) | 0.025-8 | 0.025-8 | 0.025-8 |
| $C_xH_y$ Flow (sccm) | 100-9500 | 0 | 0 |
| $H_2$ Flow (sccm) | 100-9500 | 100-9500 | 0-9500 |
| He Flow (sccm) | 0-9500 | 0-9500 | 0-9500 |
| $N_2$ Flow (sccm) | 0-9500 | 0-9500 | 0-9500 |
| Ar Flow (sccm) | 0-19,500 | 0-19,500 | 0-19,500 |
| HF RF Generator Setpoint (W) | 100-3000 | 100-3000 | 100-3000 |
| LF RF Generator Setpoint (W) | 200-5000 | 0-5000 | 0-5000 |

Table 2 provides parameters for a specific example of suitable deposition-etch-ash process conditions in accordance with an embodiment of the gap-fill process for depositing a gap-fill AHM layer 150.

TABLE 2

Example Process Parameters for Deposition of Gap-Fill AHM Layer

| Parameter | Deposition | Etch | Ash |
|---|---|---|---|
| Time (s) | 3 | 9 | 15 |
| Pressure (Torr) | 0.5 | 0.3 | 6 |
| $C_2H_2$ Flow (sccm) | 300 | 0 | 0 |
| $H_2$ Flow (sccm) | 200 | 400 | 0 |
| He Flow (sccm) | 0 | 0 | 0 |
| $N_2$ Flow (sccm) | 0 | 0 | 0 |
| Ar Flow (sccm) | 2000 | 5600 | 5000 |
| HF RF Generator Setpoint (W) | 400 | 1000 | 3000 |
| LF RF Generator Setpoint (W) | 2400 | 2000 | 0 |

TABLE 2-continued

Example Process Parameters for Deposition of Gap-Fill AHM Layer

| Parameter | Deposition | Etch | Ash |
|---|---|---|---|

In other embodiments, the process may be described by the following formula: $((Dep\text{-}Ash)_X + Etch)_Y$. Specifically, according to these embodiments, the ashing is done prior to etching the deposited carbon film. The order of etch/ash and ash/etch can be determined by such factors as the aspect ratio of the gaps formed by the pattern and throughput considerations. Additional details on deposition-etch techniques for depositing AHMs into gaps are discussed in U.S. patent Publication application Ser. No. 13/896,729, which is incorporated herein by reference.

Returning to FIG. 1E, the substrate is etched back or planarized to the core layer 105 in one, consolidated etch step that etches both the conformal layer 113 and gap-fill AHM layer to remove the conformal film overlying the core AHM layer 105 at rates such that the resulting stack is substantially planar. For example, the substrate may be etched back until the core AHM layer 105 is exposed. Alternatively, the planarizing etch may stop once all the conformal layer material overlaying the core AHM regions is removed and, for example, the cap layer 107 remains over the core AHM layer regions 150. This consolidated-etch planarization step may use chemical-mechanical planarization or polishing. The substrate may be planarized by flowing oxygen ($O_2$) and helium (He) at about 20 sccm and about 200 sccm, respectively, for about 30 seconds. Subsequently, the substrate may be exposed to aqueous hydrofluoric acid solution. The aqueous hydrofluoric acid solution may be about 1000 parts deionized (DI) water to about 1 part anhydrous HF by volume, for about 30 seconds. The substrate may also undergo a two-step plasma etch process by flowing $CF_4$ and Ar at about 5 sccm and about 100 sccm, respectively, for about 10 seconds, and flowing $CHF_3$ and $CF_4$ at about 15 sccm and about 80 sccm, respectively, for about 30 seconds.

Planarization to the core layer 105 may be performed at a temperature between about −10° C. and about 20° C. and at a pressure of between about 2 mTorr and about 20 mTorr. The substrate may be etched for a time between about 10 seconds and about 60 seconds if the conformal film used includes $SiO_2$ and SiN chemistry.

Figure 1E:
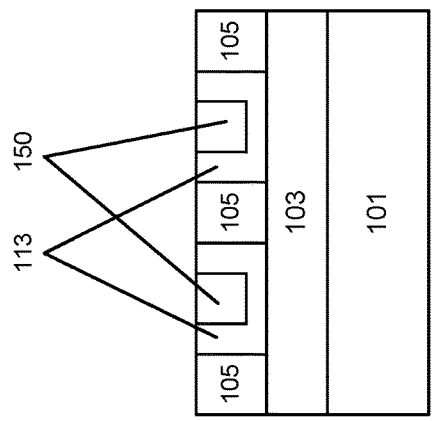

Etching methods in this step may involve plasma etching. Note that in this step, as shown in FIG. 1E, unlike conventional double patterning techniques, the conformal film 113 is not etched prior to etching to the core layer 105.

Figure 1F:
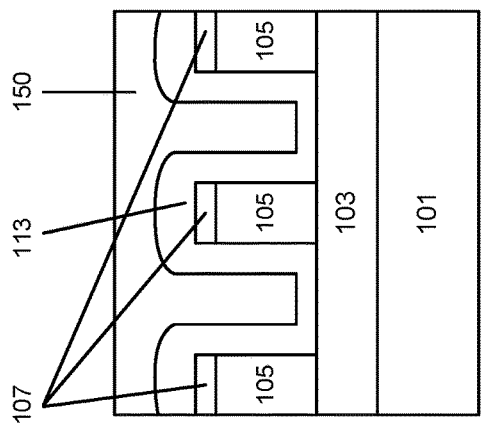

In FIG. 1F, the conformal layer 113 is etched to form the mask anisotropically, such that the patterned mask is defined by free-standing structures of gap-fill AHM 150 and core AHM 105. The robustness of the gap-fill AHM due to the method of deposition as described above facilitates the efficient and productive use of the layer as a mask to etch subsequent layers. This mask can then be used to etch layers and ultimately the target layer 101. Etching in this step may be performed at a temperature between about 30° C. and about 70° C. and at a pressure of between about 5 mTorr and about 10 mTorr. The substrate may be etched for a time between about 20 seconds and about 60 seconds using plasma etching.

Figure 1G:
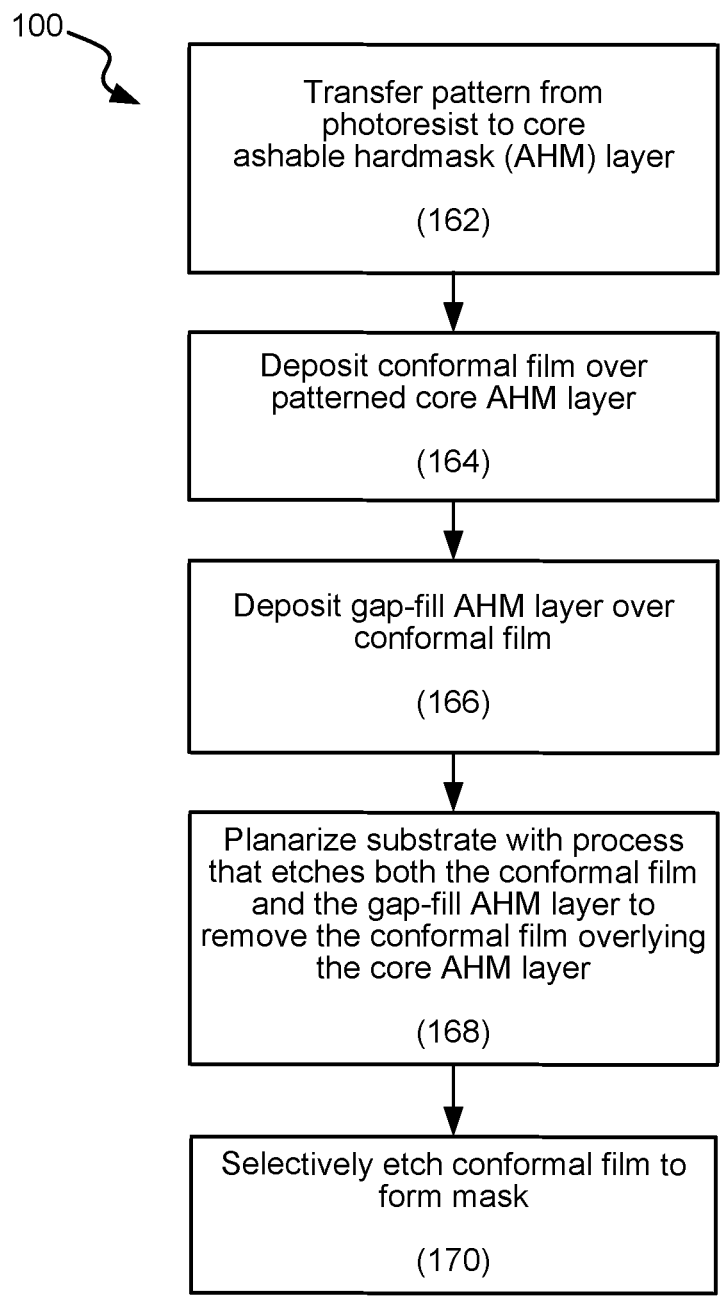
FIG. 1G is a process flow diagram for processing semiconductor substrates in accordance with various embodiments.

FIG. 1G is a process flow diagram representing a method 100 to process a semiconductor substrate in accordance with various embodiments. In operation 162, a pattern is transferred from a photoresist to a core AHM layer. In operation 164, a conformal film is deposited over a patterned core AHM layer. In operation 166, a gap-fill AHM layer is deposited over the conformal film. In operation 168, the substrate is planarized with a process that etches both the conformal film and the gap-fill AHM layer to remove the conformal film overlying the core AHM layer. In operation 170, the conformal film is selectively etched to form the mask. Optionally, the mask may be patterned to a target layer.

Use of the deposited gap-fill AHM in this process scheme provides robust carbon films to create fine patterns with low line edge roughness less than about 2 nm (3sigma). The AHM as a result of the deposition method for the gap-fill layer forms highly stable, free-standing structures in the final mask pattern, which is able to withstand buckling or cracking. Such AHMs are also very selective to most other films. Moreover, the process scheme for single-etch planarization eliminates a conformal film or spacer etch step in patterning, thereby improving efficiency and reducing cost.

Two-Dimensional Patterning with Image Reversal and Robust Mask

Provided herein is an example of another application of the method recited in the disclosed embodiments. In this application, two-dimensional patterning to form holes below lithographic pitch is achieved using robust gap-fill AHMs deposited with methods described above. FIGS. 2A-15C depict schematic illustrations of various process steps in this two-dimensional patterning example. In the following description, figures labeled with an "A" depict the front view of a three-dimensional, multi-layer stack of a substrate for patterning. Figures labeled with a "B" depict the side view of the same stack, and figures labeled with a "C" depict a top view of the stack, where the bottom side of the top view corresponds with the front view of the stack. Note that the following description and the corresponding figures are for example only.

Figure 2A:
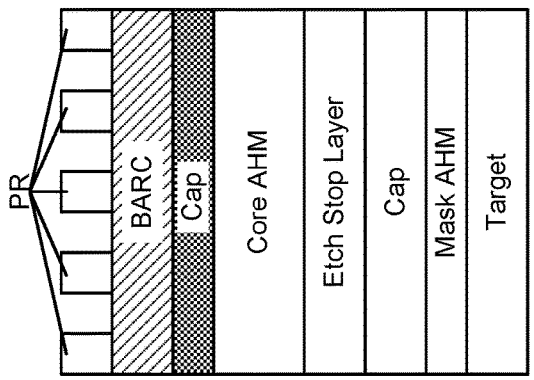
Figure 2B:
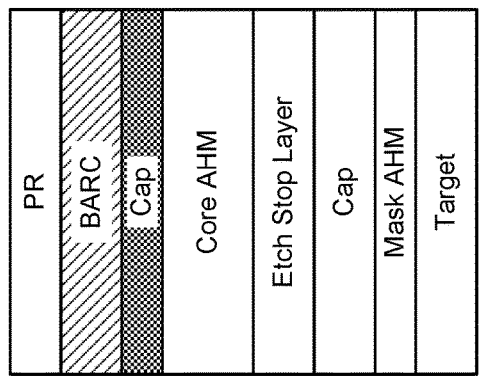

A multi-layer stack of a substrate is provided as shown in FIG. 2A. The bottom layer of the stack is a target layer, which may be the layer to be ultimately etched. Above the target layer is a mask layer, which may be an AHM layer. Such a layer may be a layer of diamond-like carbon, or a highly selective and transparent carbon-based layer. This layer is hereinafter referred to as the "mask AHM layer." Above the mask AHM layer is a cap layer, which may optionally be an etch stop layer. The etch stop layer or cap layer may be any of those listed above with reference to layer 103 or 107 in FIG. 1A. For purposes of this description, this layer is hereinafter referred to as a "cap" layer. Above the cap layer is an etch stop layer, which may be any of those listed above with reference to layer 103 in FIG. 1A. On top of the etch stop layer is a core AHM layer, which may have any of the properties of the core AHM layer 105 described above with respect to FIG. 1A. On top of the core AHM layer is another "cap" layer, which may likewise be made of any of the materials listed above with reference to cap layer 107 of FIG. 1A. On top of the cap layer is a BARC layer, which may be any of the materials listed above with reference to BARC layer 109 of FIG. 1A. At the top of the stack is a lithographically patterned photoresist (PR), which may be made of any of the materials listed above with reference to photoresist layer 111 in FIG. 1A.

In this step, a patterned PR is provided on a multi-layer film stack. Note that in FIG. 2B, the PR layer extends from the front of the stack to the back of the stack, indicating the PR pattern involves strips of PR elongating from the back of the stack to the front of the stack represented by FIG. 2A.

Figure 3A:
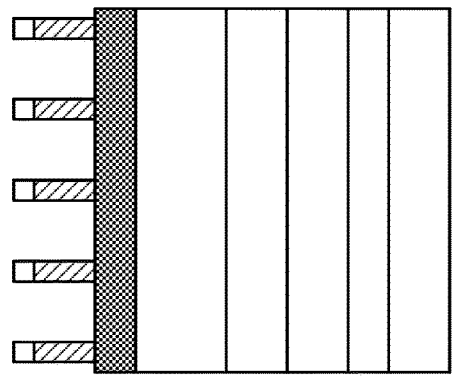
Figure 3B:
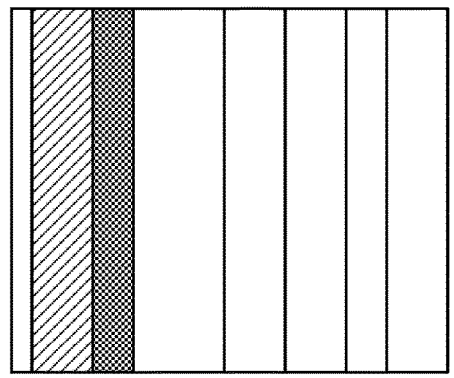

In FIG. 3A, the pattern is transferred to the BARC layer such that the BARC layer is etched while the pattern is simultaneously trimmed. This step is similar to the step shown in FIG. 1B as described above. Any of the conditions with respect to FIG. 1B may be used in this step as performed in an etching apparatus. Note here that side view FIG. 3B shows that the pattern was etched in one dimension such that the BARC is exposed as strips elongated from the back to the front of the stack.

Figure 4A:
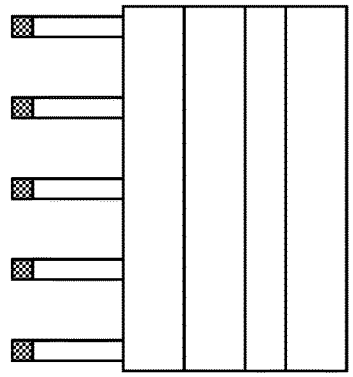
Figure 4B:
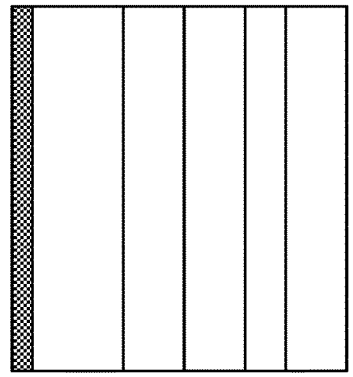

In FIG. 4A, the pattern is further transferred to the core layer through the cap layer and both the PR and BARC layer are removed. Note that this step is similar to the step described with respect to FIG. 1C above and any of the conditions and methods for the above one-dimensional etching step in FIG. 1C may be implemented in this step. Note the side view in FIG. 4B shows that both the PR and BARC layers have been stripped.

Figure 5A:
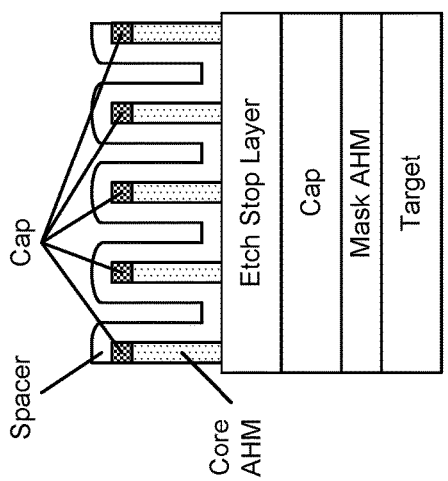
Figure 5B:
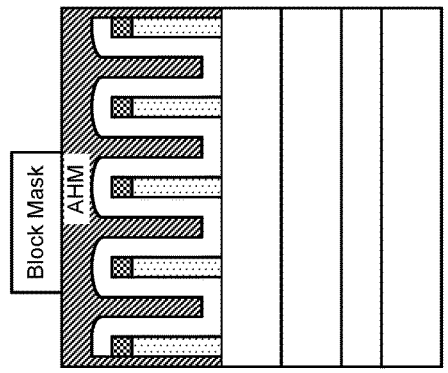

In FIG. 5A, a conformal layer, or spacer, is deposited on top of the cap layer. Similar to FIG. 1D as described above, the conformal layer here may be referred to as a spacer. The spacer may be an oxide or silicon nitride and is deposited to form an evenly distributed layer over the pattern. The spacer may be deposited by ALD, PEALD, PECVD, or other suitable deposition methods in a deposition apparatus. The following conditions are examples of conditions suitable for depositing a silicon oxide conformal layer by a PEALD process: The temperature may be between about 50° C. and about 400° C., for example about 50° C.; the pressure may be between about 0.5 Torr and about 10 Torr, for example about 2-3 Torr; RF power, for four 300 mm wafers, may be between about 100 and 2500 W, for example about 500-600 W, so as not to damage substrate. The process gases that may be used include, as a silicon source, a silicon amide (e.g., BTBAS—bis-t-butyl aminosilane, BDEAS (bis-di-ethyl aminosilane) or DIPAS (di-isopropyl aminosilane), and, as an oxygen source, oxygen or nitrous oxide, separately or together, diluted with an inert carrier gas, for example argon or nitrogen. Process gas flow rates may be as follows: for (liquid) silicon precursor (BTBAS, BDEAS, DIPAS), between about 1 and 3 ccm, for example BTBAS at about 2.5 ccm; for oxygen precursor ($O_2$, $N_2O$), between about 5000 sccm and about 10,000 sccm, for example $N_2O$ at 5000 sccm; and for the carrier gas (Ar or $N_2$), between about 0 and 10,000, for example about 5000 Ar. Note the side view in FIG. 5B shows the deposited spacer layer above the cap layer as a cross sectional view.

Figure 6A:
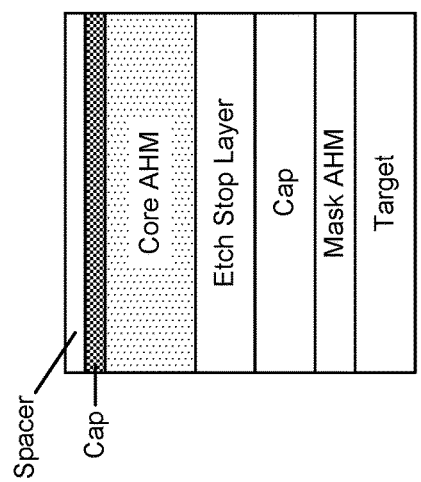
Figure 6B:
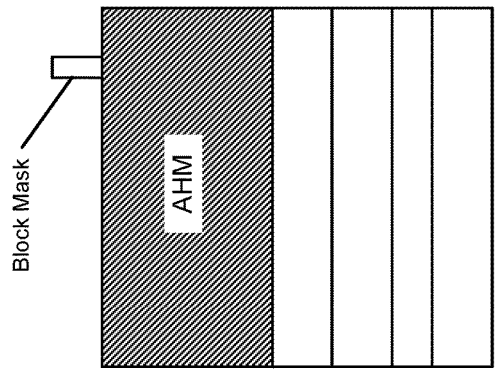

In FIG. 6A, a gap-fill AHM layer is deposited over the conformal film to fill in gaps created by the pattern. The deposition of the AHM layer in this step is similar to the deposition as described above with respect to FIG. 1D and may use the deposition-etch-ash method and conditions described above. A PECVD anti-reflective layer (ARL) (not shown) may also be deposited on top of the AHM layer such that the ARL has etch selectivity to the underlying AHM layer.

Alternatively, this carbon-based layer may be deposited by spin-on methods. If a carbon layer is deposited by spin-on methods, a very thin silicon-based anti-reflective coating (Si-ARC) layer (not shown) may be deposited on top of the carbon layer such that the thin layer has etch selectivity to the underlying carbon-based gap-fill layer.

In this same figure, on top of the PECVD ARL, a photoresist is deposited and patterned to define the shape of the areas where holes are not desired within the two dimensional patterning stack. This pattern may then be used as a block mask. In this case, the block mask as shown in FIG. 6A spans a short distance from just inside the left edge of the stack to about halfway in the middle of the stack, and is relatively thin as shown in side-view FIG. 6B towards the front edge of the stack. The photoresist may be carbon-based and may be anti-reflective in some embodiments.

In FIG. 7A, the gap-fill AHM layer is etched using the photoresist block mask such that the PECVD ARL, gap-fill AHM, and PR is opened. The spacer is further etched to the etch stop layer, resulting in various patterned blocks of core AHM and spacer to maintain the shape of the hole to be formed. The following may be suitable process conditions for etching the gap-fill AHM layer to follow the pattern made by the photoresist block mask, and removing the gap-fill AHM layer. The temperature may be between about 30° C. and about 50° C., the pressure may be between about 2 mTorr and about 10 mTorr, the process gases that may be used include $O_2$, $SO_2$, and He, which may be flowed at flow rates of about 10 sccm to about 70 sccm, about 100 sccm to about 200 sccm, and about 100 sccm to about 300 sccm, respectively. This step may be performed in an appropriate etching apparatus.

Note the side-view FIG. 7B shows a remaining spacer and AHM as part of the tri-layer resist and the core AHM layer beneath it. A top-view is provided in FIG. 7C, which shows the pattern of the hole where the AHM has been deposited situated at the bottom left corner of the stack such that it is closer to the front of the stack which is represented by FIG. 7A, and is closer to the left of the stack which is represented by FIG. 7B, than the right edge of the stack. A gradual formation of a two-dimensional pattern is shown in this step.

In FIG. 8A, the core AHM layer is ashed out using an ashing method and the AHM layer on top of the conformal layer is also removed, leaving behind the remaining spacer pattern, including the cap and the core layer below the spacer where the block mask had defined the hole to be made. Note the side-view in FIG. 8B shows that only spacer can be seen in the top layer from the side since the spacer covers the cap and core AHM layers beneath it in the defined hole position, with the remaining etch stop layer, cap, mask AHM, and target layers below. The top-view in FIG. 8C likewise shows only the etch stop layer between the strips of spacer and the defined hole pattern is also covered with spacer.

The ashing process may be more isotropic in nature since it is largely dependent on chemical interactions for material removal rather than directional movement of energetic ions such as in etching an AHM layer. For example, any surface that is exposed to the process gas used in an ashing operation may experience material removal due to the exposure, so the AHM material used in the core and under the block mask may have high etch selectivity to the spacer such that the spacer is not etched while the AHM layers are ashed. Additionally, in contrast to some chemical etching processes, ashing operations may produce a reaction product that is completely in the gas phase. Accordingly, ashing operations may not produce particulate byproducts that may contaminate a wafer as may be the case with other types of chemical material removal processes. Ashing operations for carbon films may, for example, utilize dissociated $H_2$ or $O_2$ as a process gas, which may react with carbon films to form such gas-phase reaction byproducts. Any of the conditions listed above in Table 1 in the "Ash" column may be used in this step to ash the core AHM and AHM layer on top of the spacer.

Figure 9A:
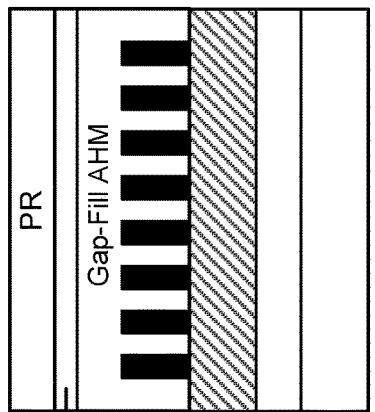
Figure 9B:
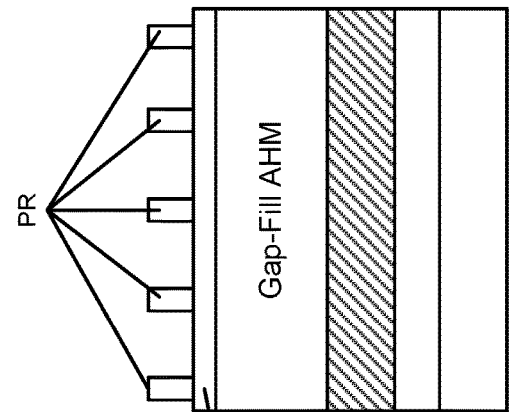
Figure 9C:
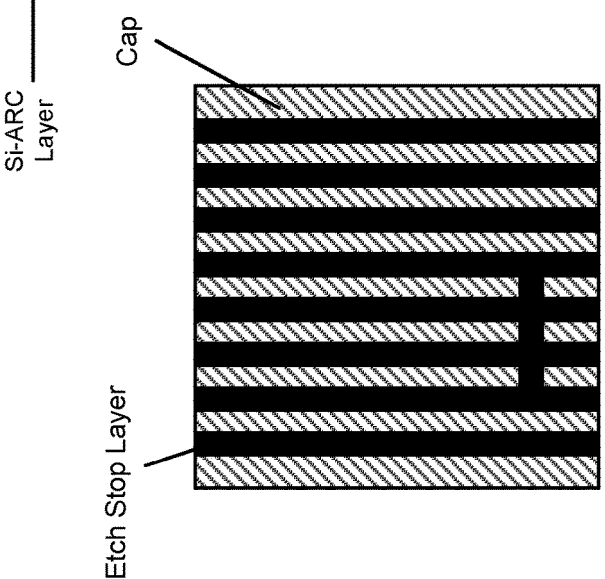

In FIG. 9A, the spacer is used as a mask to etch the etch stop layer to the cap layer, thereby transferring the pattern to the etch stop layer. Then, the spacer is removed by etching methods, leaving behind a patterned etch stop layer with the defined hole. Note in the side-view in FIG. 9B, the etch stop layer on the left edge is a single strip such that the strip runs from the back of the stack to the front. A top-view in FIG. 9C further shows the strips of etch stop layer as defined from the spacer and the resulting cap layer beneath the etch stop layer.

In order to transfer the pattern from the spacer to the etch stop layer, the following process conditions are used. The temperature may be between about 50° C. and about 70° C., the pressure may be between about 5 mTorr and about 10 mTorr, the process gases that may be used include $Cl_2$, and HBr, which may be flowed at flow rates of about 20 sccm to 40 sccm, and 100 sccm to 300 sccm, respectively.

The spacer may be removed using the following process conditions. The temperature may be between about 50° C. and about 70° C., the pressure may be between about 2 mTorr and about 20 mTorr, the process gases that may be used include $CHF_3$ and $CF_4$, which may be flowed at flow rates of about 30 sccm to about 50 sccm, and about 50 sccm to about 100 sccm, respectively.

Figure 10A:
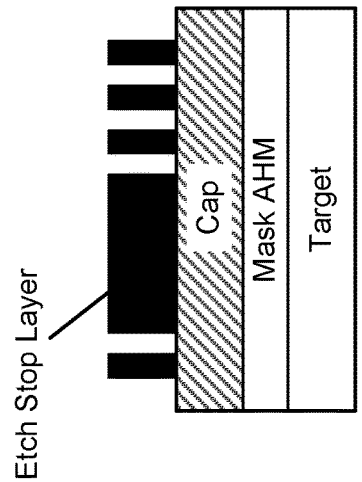
Figure 10B:
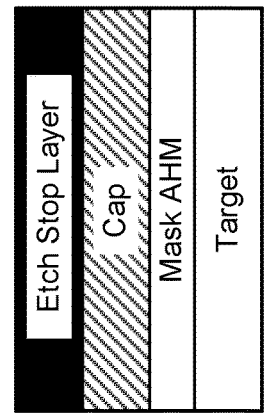

In FIG. 10A, a gap-fill AHM layer is deposited, followed by a thin PECVD ARL, and a photoresist layer is deposited and patterned. In these steps, the gap-fill AHM layer may be deposited by the deposition-etch-ash method described above with respect to FIG. 1D, and the ARL and photoresist layer deposition and patterning may have process conditions such as those described above with respect to FIG. 6A-6B. These layers may be deposited in a deposition apparatus. The pattern from the front-view in FIG. 10A depicts individual strips of the etch stop layer because the defined hole is set away from the front edge of the stack. Therefore, when gap-fill AHM is deposited between the etch stop layer strips, it also fills the gaps between the etch stop layer strips in front of the defined hole.

Alternatively, a novel cap layer, an etch stop layer, or a non-silicon-based anti-reflective layer may be deposited instead of the ARL. Note also in this step, the photoresist is patterned in the other direction, thereby forming strips elongated from the left side of the stack to the right side of the stack. This is better depicted by the side-view shown in FIG. 10B, where the photoresist is shown as being deposited in strips on top of the ARL and gap-fill AHM layer.

Further note that the gap-fill AHM layer deposited by the deposition-etch-ash method by PECVD provides a particularly robust and strong layer filling the fine features as defined by the etch stop layer mask. These stable structures are essential in patterning steps, especially for particularly fine patterns.

Optionally, the photoresist may be trimmed in the deposition apparatus. If the photoresist was patterned lithographically with the desired critical dimension, then the optional trimming step may be skipped. Suitable conditions for trimming in the deposition apparatus may be any of a combination of the following. The temperature may be between about 40° C. and 60° C., the pressure may be between about 500 mTorr and about 1 Torr, the process gases that may be used include oxygen ($O_2$) and argon (Ar), which may be flowed at flow rates of about 50 sccm to 100 sccm, and 200 sccm to 400 sccm, respectively.

In FIG. 11A, a conformal layer or spacer is deposited on top of the photoresist pattern. Note that since the strips of the pattern run left to right, a front-view as shown in FIG. 11A depicts a solid spacer layer on top of a PECVD ARL. The side-view as shown in FIG. 11B shows the spacer deposited conformally to the shape of the photoresist pattern. The spacer may be deposited by ALD, and may be silicon-based, such as made of $SiO_2$. The spacer may be deposited at a temperature below about 80° C., particularly if the photoresist material is susceptible to change at a temperature at or above about 100° C.

In FIGS. 12A and 12B, the spacer is etched down until the photoresist is exposed and the PECVD ARL is also exposed. As shown in FIG. 12A, a front-view only shows some etching to the thickness of the spacer, but the side-view in FIG. 12B shows that the spacer is etched down to the PECVD ARL, such that the photoresist is then exposed. This etch may occur in an etching apparatus with the following conditions. The temperature may be between about 40° C. and 60° C., the pressure may be between about 5 mTorr and about 20 mTorr, the process gases that may be used include $CF_4$ and HBr, which may be flowed at flow rates of about 50 sccm to 200 sccm, and about 50 sccm to 200 sccm, respectively.

In FIGS. 13A and 13B, the photoresist is etched down to the PECVD ARL and removed, leaving only the remaining spacer pattern. This photoresist etching step may be performed in an etching apparatus with the following conditions. The temperature may be between about 40° C. and about 60° C., the pressure may be between about 5 mTorr and about 20 mTorr, the process gases that may be used include $O_2$, which may be flowed at flow rates of about 100 sccm to about 200 sccm.

Figure 14C:
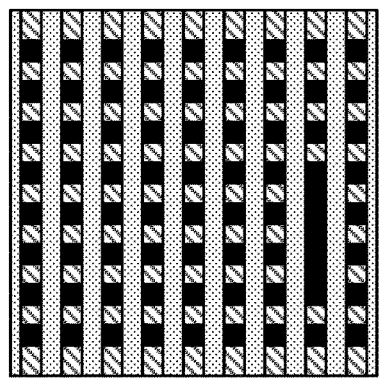
Figure 14A:
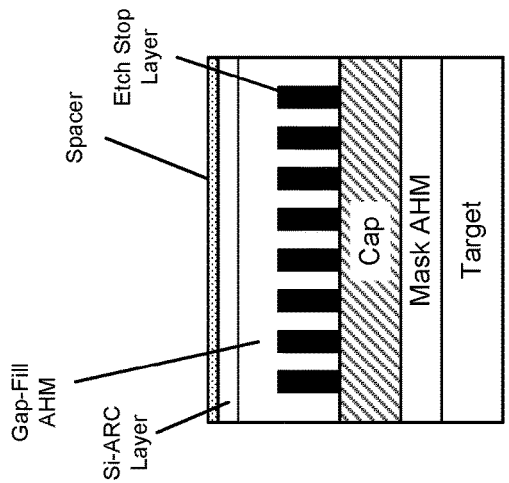
Figure 14B:
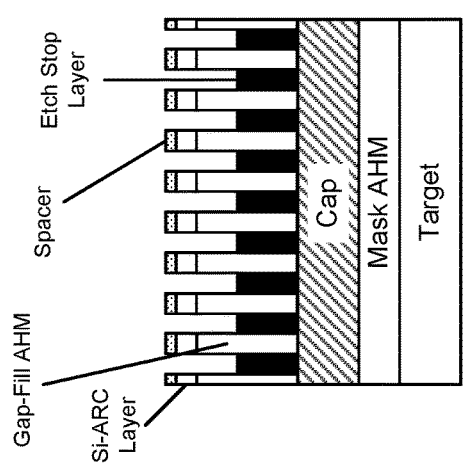

In FIGS. 14A, 14B, and 14C, the PECVD ARL and gap-fill AHM layer below the spacers are etched down to the cap layer below using the spacer as a mask. Note that in the front-view of FIG. 14A, a small amount of spacer may remain on the top of the PECVD ARL. The side-view shown in FIG. 14B clearly show the pattern formed by etching down and stopping at the cap layer, but due to the patterning of the stack, parts of the etch stop layer that defined the first dimension of the pattern are shown through the gaps between the gap-fill AHM remaining under the spacer layers. Visible from the top-view in FIG. 14C is the cap layer on the bottom where the etching step stopped, with the etch stop layer patterned in prior steps with the defined hole, and intertwined with the etch stop layer is the patterned gap-fill AHM layer, represented by the spacer pattern in horizontal stripes across because of the small remaining spacer material on top of each of the pattern lines.

This step may occur in an etching apparatus with the following conditions. The temperature may be between about 30° C. and 50° C., the pressure may be between about 2 mTorr and about 10 mTorr, the process gases that may be used include $O_2$, $SO_2$, and He, which may be flowed at flow rates of about 10 sccm to 70 sccm, about 10 sccm to 200 sccm, and about 100 sccm to 300 sccm, respectively.

It is noted here that use of the gap-fill AHM deposited in the deposition-etch-ash method is particularly important in this step because the gap-fill AHM layer has the necessary stable and robust structure defining these lines with low line roughness without buckling or cracking.

Figure 15A:
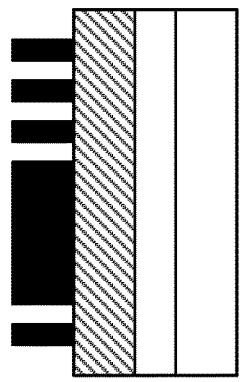
Figure 15B:
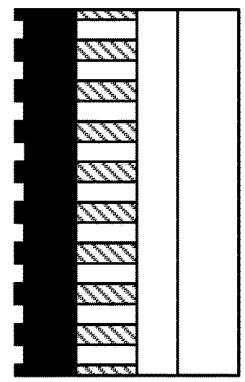
Figure 15C:
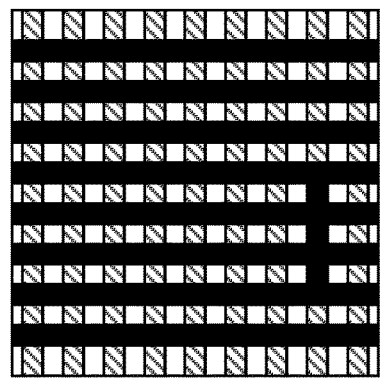

Lastly, in FIGS. 15A-15C, the pattern is transferred to the cap layer by using the gap-fill AHM layer as a mask. The etch stops at the mask AHM layer, thereby forming the fine features in the cap layer. Then, the spacer, PECVD ARL, and gap-fill AHM layer are ashed and removed, such that the resulting two-dimensional pattern remains on the stack. Note that in the side view FIG. 15B, the top surface is slightly staggered because during this etch, the etch stop layer may be slightly etched while the cap layer is etched. Nonetheless, the two-dimensional patterning with the defined hole as shown in FIG. 15C is formed in this step. The two-dimensional pattern can now be used such that the pattern is transferred to the mask and the target layer is patterned using the mask layer to complete the patterning process.

In this step, the following conditions and methods may be used. The temperature may be between about 50° C. and 90° C., the pressure may be between about 5 mTorr and about 100 mTorr, the process gases that may be used include $Cl_2$, HBr, and He, which may be flowed at flow rates of about 10 sccm to 100 sccm, about 10 sccm to 100 sccm, and about 100 sccm to 200 sccm, respectively.

Figure 16:
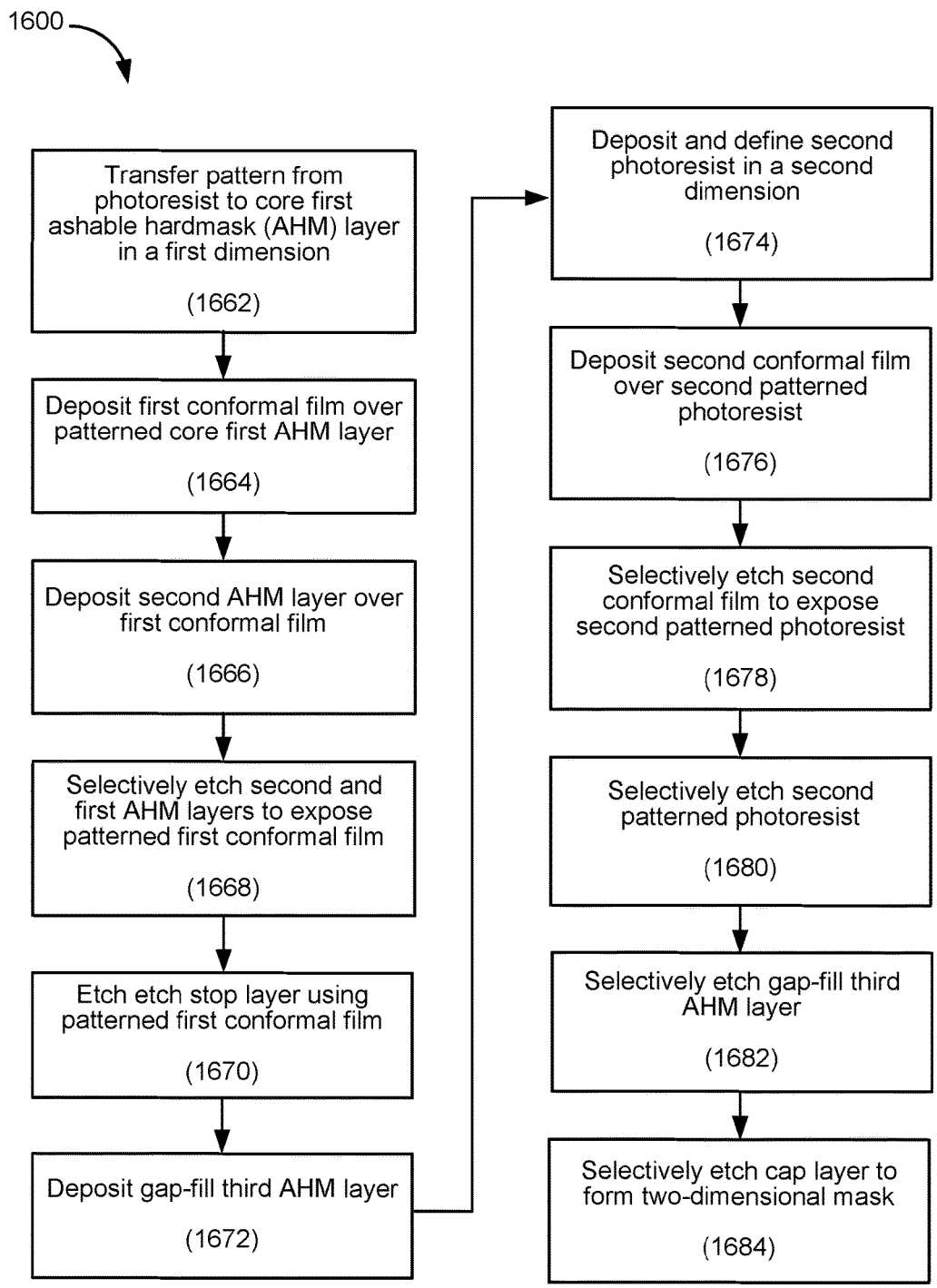
FIG. 16 is a process flow diagram for processing semiconductor substrates in accordance with various embodiments.

FIG. 16 is a process flow diagram of selected operations of a method 1600 in accordance with disclosed embodiments. In operation 1662, a pattern is transferred from a first photoresist to a core first AHM layer in a first dimension. In operation 1664, a first conformal film is deposited over the patterned core first AHM layer. In operation 1666, a second AHM layer is deposited over the first conformal film. In operation 1668, the first and second AHM layers are selectively etched to expose the patterned first conformal film. In operation 1670, the etch stop layer is etched using the patterned first conformal film. In operation 1672, a gap-fill third AHM layer is deposited.

In operation 1674, a second photoresist is deposited and lithographically defined in a second dimension. In operation 1676, a second conformal film is deposited over the second patterned photoresist. In operation 1678, the second conformal film is selectively etched to expose the second patterned photoresist. In operation 1680, the second patterned photoresist is selectively etched. In operation 1682, the gap-fill third AHM layer is selectively etched. In operation 1684, a cap layer is selectively etched to form a two-dimensional mask. Optionally, the two-dimensional mask may then be used to pattern a target layer.

Apparatus

Deposition techniques provided herein may be implemented in a plasma enhanced chemical vapor deposition (PECVD) reactor. Such a reactor may take many forms, and may be part of an apparatus that includes one or more chambers or "reactors" (sometimes including multiple stations) that may each house one or more wafers and may be configured to perform various wafer processing operations. The one or more chambers may maintain the wafer in a defined position or positions (with or without motion within that position, e.g., rotation, vibration, or other agitation). In one implementation, a wafer undergoing film deposition may be transferred from one station to another within a reactor chamber during the process. In other implementations, the wafer may be transferred from chamber to chamber within the apparatus to perform different operations, such as etching operations or lithography operations. The full film deposition may occur entirely at a single station or any fraction of the total film thickness for any deposition step, such as deposition steps for conformal film deposition or gap-fill AHM layer deposition, may be deposited at any number of stations or chambers.

While in process, each wafer may be held in place by a pedestal, wafer chuck, and/or other wafer-holding apparatus. For certain operations in which the wafer is to be heated, the apparatus may include a heater, such as a heating plate. A Vector™ (e.g., C3 Vector) or Sequel™ (e.g., C2 Sequel) reactor, produced by Lam Research Corp. of Fremont, Calif., are both examples of suitable reactors that may be used to implement the techniques described herein.

Figure 17:
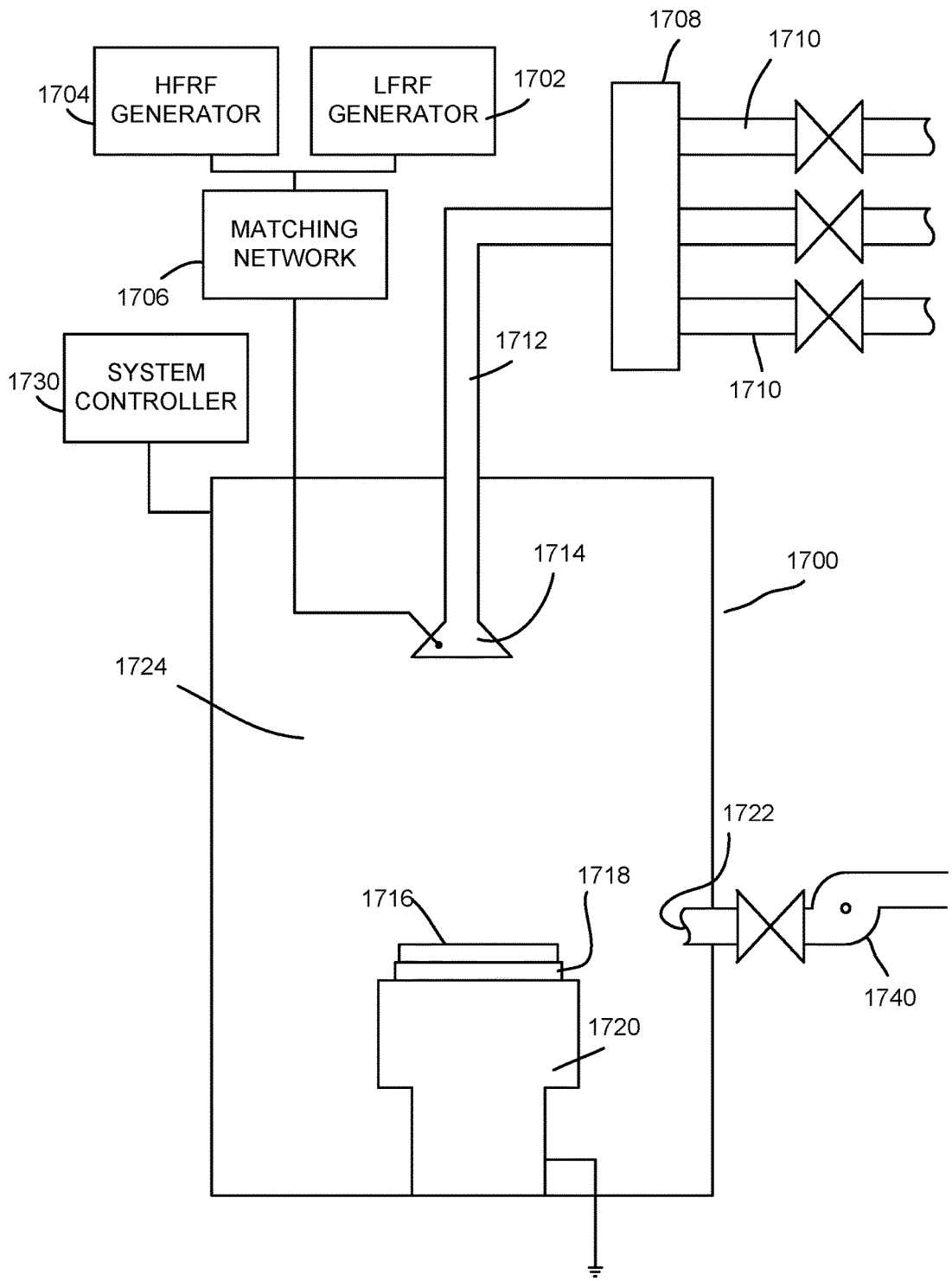
FIG. 17 depicts a simple block diagram showing various reactor components arranged for implementing techniques in accordance with disclosed embodiments.

FIG. 17 provides a simple block diagram depicting various reactor components arranged for implementing methods described herein. As shown, a reactor 1700 includes a process chamber 1724 that encloses other components of the reactor and serves to contain a plasma generated by a capacitive-discharge type system including a showerhead 1714 working in conjunction with a grounded heater block 1720. A high frequency (HF) radio frequency (RF) generator 1704 and a low frequency (LF) RF generator 1702 may be connected to a matching network 1706 and to the showerhead 1714. The power and frequency supplied by matching network 1706 may be sufficient to generate a plasma from process gases supplied to the process chamber 1724. For example, the matching network 1706 may provide 100 W to 5000 W of HFRF power and 100 W to 5000 W of LFRF power total energy. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the reactor, a wafer pedestal 1718 may support a substrate 1716. The wafer pedestal 1718 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 1712. Multiple source gas lines 1710 are connected to manifold 1708. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 1724 via an outlet 1722. A vacuum pump, e.g., a one or two stage mechanical dry pump and/or turbomolecular pump 1740, may be used to draw process gases out of the process chamber 1724 and to maintain a suitably low pressure within the process chamber 1724 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition and/or post-deposition plasma treatment, or may be indexed after etching steps if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 1730 having instructions for controlling process operations in accordance with the disclosed embodiments. The system controller 1730 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments, e.g., a technique such as that provided in the deposition steps of FIG. 1. Machine-readable media containing instructions for controlling process operations in accordance with the present disclosure may be coupled to the system controller 1730. The controller 1730 may be communicatively connected with various hardware devices, e.g., mass flow controllers, valves, RF generators, vacuum pumps, etc. to facilitate control of the various process parameters that are associated with the deposition, etching, and ashing operations as described herein.

In some embodiments, a system controller 1730 may control all of the activities of the reactor 1700. The system controller 1730 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 1700. The system control software may be configured in any suitable way. For example, various process tool component subroutines or control objects may be written to control operation of the process tool components necessary to carry out various process tool processes. The system control software may be coded in any suitable computer readable programming language.

The system controller 1730 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 1730.

The method and apparatus describe herein may be used in conjunction with lithographic patterning tools or processes such as those described below for fabrication or manufacture of semiconductor devices, displays, LEDs, photovoltaic panels, and the like. Typically, though not necessarily, such tools/processes will be used or conducted together in a common fabrication facility. Lithographic patterning of a film typically comprises some or all of the following steps, each step performed with a number of possible tools: (1) application of photoresist on a workpiece, i.e., substrate or multi-layer stack as provided in disclosed embodiments, using a spin-on or spray-on tool; (2) curing a photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferred the resist pattern into an underlying film or workpiece, such as a carbon-based gap-fill AHM layer, by using a dry or plasma-assisted etching tool such as those described below; and (6) removing the resist using a tool such as an RF or microwave plasma resist stripper. In one implementation, one or more gap features on a wafer are filled with a carbon film using a technique as described herein. The carbon film may then be used, for example, for one of the purposes described herein. Further the implementation may include one or more of steps (1) through (6) described above.

Figure 18:
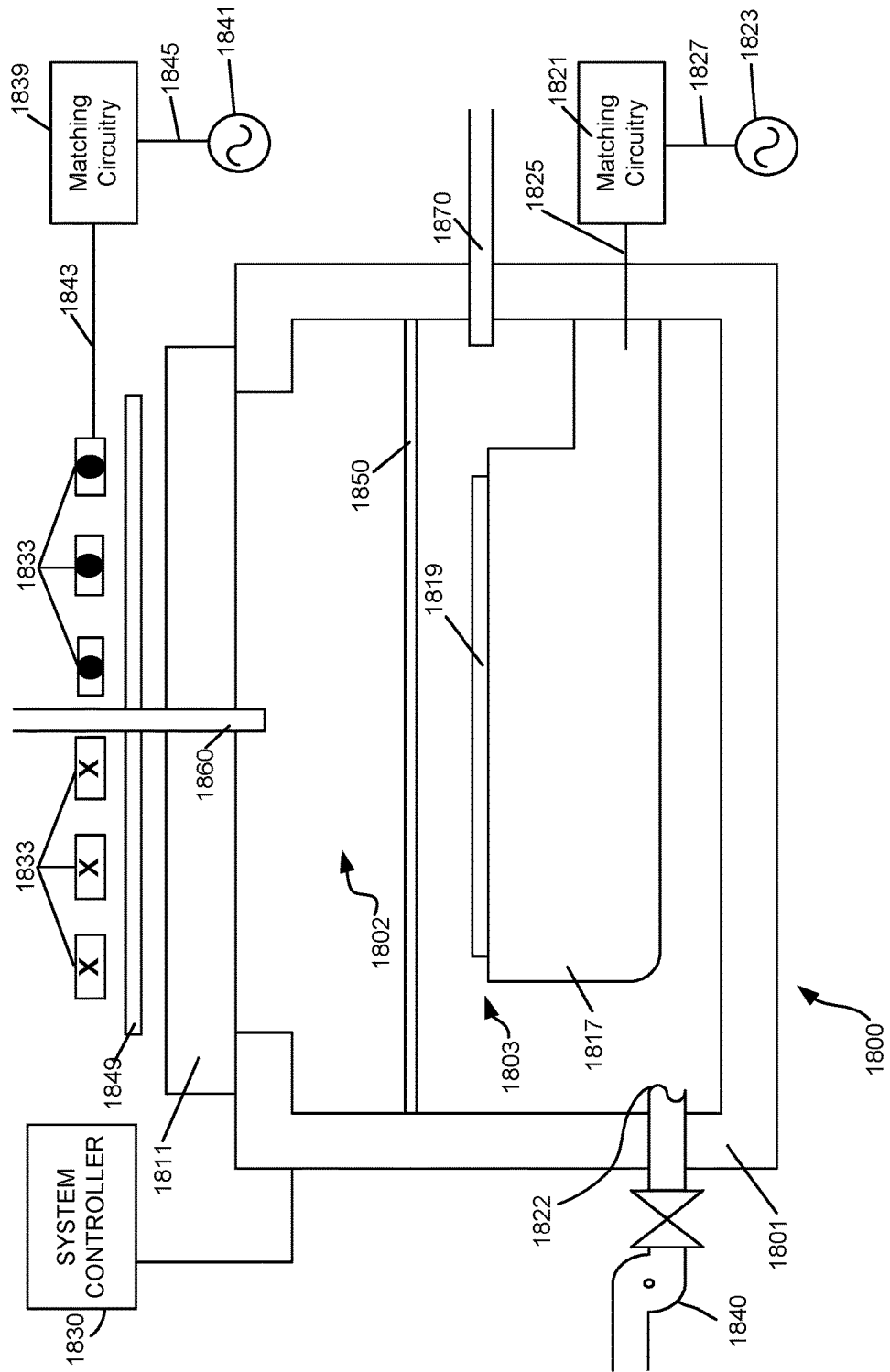
FIG. 18 depicts a schematic cross-sectional diagram illustrating a system for implementing techniques in accordance with disclosed embodiments.

FIG. 18 schematically shows a cross-sectional view of an inductively coupled plasma etching apparatus 1800 in accordance with certain embodiments herein. A Kiyo™ reactor, produced by Lam Research Corp. of Fremont, Calif., is an example of a suitable reactor that may be used to implement the techniques described herein. The inductively coupled plasma etching apparatus 1800 includes an overall etching chamber structurally defined by chamber 1801 and a window 1811. The chamber 1801 may be fabricated from stainless steel or aluminum. The window 1811 may be fabricated from quartz or other dielectric material. An optional internal plasma grid 1850 divides the overall etching chamber into an upper sub-chamber 1802 and a lower sub-chamber 1803. In most embodiments, plasma grid 1850 may be removed, thereby utilizing a chamber space made of sub-chambers 1802 and 1803. A chuck 1817 is positioned within the lower sub-chamber 1803 near the bottom inner surface. The chuck 1817 is configured to receive and hold a semiconductor wafer 1819 upon which the etching process is performed. The chuck 1817 can be an electrostatic chuck for supporting the wafer 1819 when present. In some embodiments, an edge ring (not shown) surrounds chuck 1817, and has an upper surface that is approximately planar with a top surface of a wafer 1819, when present over chuck 1817. The chuck 1817 also includes electrostatic electrodes for chucking and dechucking the wafer. A filter and DC clamp power supply (not shown) may be provided for this purpose. Other control systems for lifting the wafer 1819 off the chuck 1817 can also be provided. The chuck 1817 can be electrically charged using an RF power supply 1823. The RF power supply 1823 is connected to matching circuitry 1821 through a connection 1827. The matching circuitry 1821 is connected to the chuck 1817 through a connection 1825. In this manner, the RF power supply 1823 is connected to the chuck 1817.

A coil 1833 is positioned above window 1811. The coil 1833 is fabricated from an electrically conductive material and includes at least one complete turn. The exemplary coil 1833 shown in FIG. 18 includes three turns. The cross-sections of coil 1833 are shown with symbols, and coils having an "X" extend rotationally into the page, while coils having a "●" extend rotationally out of the page. An RF power supply 1841 is configured to supply RF power to the coil 1833. In through a connection 1845. The matching general, the RF power supply 1841 is connected to matching circuitry 1839 circuitry 1839 is connected to the coil 1833 through a connection 1843. In this manner, the RF power supply 1841 is connected to the coil 1833. An optional Faraday shield 1849 is positioned between the coil 1833 and the window 1811. The Faraday shield 1849 is maintained in a spaced apart relationship relative to the coil 1833. The Faraday shield 1849 is disposed immediately above the window 1811. The coil 1833, the Faraday shield 1849, and the window 1811 are each configured to be substantially parallel to one another. The Faraday shield may prevent metal or other species from depositing on the dielectric window of the plasma chamber.

Process gases may be supplied through a main injection port 1860 positioned in the upper chamber and/or through a side injection port 1870, sometimes referred to as an STG. A vacuum pump 1840, e.g., a one or two stage mechanical dry pump and/or turbomolecular pump, may be used to draw process gases out of the process chamber 1824 and to maintain a pressure within the process chamber 1800 by using a closed-loop-controlled flow restriction device, such as a throttle valve (not shown) or a pendulum valve (not shown), during operational plasma processing.

During operation of the apparatus, one or more reactant gases may be supplied through injection ports 1860 and/or

1870. In certain embodiments, gas may be supplied only through the main injection port 1860, or only through the side injection port 1870. In some cases, the injection ports may be replaced by showerheads. The Faraday shield 1849 and/or optional grid 1850 may include internal channels and holes that allow delivery of process gases to the chamber. Either or both of Faraday shield 1849 and optional grid 1850 may serve as a showerhead for delivery of process gases.

Radio frequency power is supplied from the RF power supply 1841 to the coil 1833 to cause an RF current to flow through the coil 1833. The RF current flowing through the coil 1833 generates an electromagnetic field about the coil 1833. The electromagnetic field generates an inductive current within the upper sub-chamber 1802. The physical and chemical interactions of various generated ions and radicals with the wafer 1819 selectively etch features of the wafer.

If the plasma grid is used such that there is both an upper sub-chamber 1802 and a lower sub-chamber 1803, the inductive current acts on the gas present in the upper sub-chamber 1802 to generate an electron-ion plasma in the upper sub-chamber 1802. The optional internal plasma grid 1850 limits the amount of hot electrons in the lower sub-chamber 1803. In some embodiments, the apparatus is designed and operated such that the plasma present in the lower sub-chamber 1803 is an ion-ion plasma.

Both the upper electron-ion plasma and the lower ion-ion plasma may contain positive and negative ions, through the ion-ion plasma will have a greater ratio of negative ions to positive ions. Volatile etching byproducts may be removed from the lower-subchamber 1803 through port 1822.

The chuck 1817 disclosed herein may operate at elevated temperatures ranging between about 30° C. and about 250° C. The temperature will depend on the etching process operation and specific recipe. In some embodiments, the chamber 1801 may also operate at pressures in the range of between about 1 mTorr and about 95 mTorr. In certain embodiments, the pressure may be higher as disclosed above.

Chamber 1801 may be coupled to facilities (not shown) when installed in a clean room or a fabrication facility. Facilities include plumbing that provide processing gases, vacuum, temperature control, and environmental particle control. These facilities are coupled to chamber 1801, when installed in the target fabrication facility. Additionally, chamber 1801 may be coupled to a transfer chamber that allows robotics to transfer semiconductor wafers into and out of chamber 1801 using typical automation.

In some embodiments, a system controller 1830 (which may include one or more physical or logical controllers) controls some or all of the operations of an etching chamber. The system controller 1830 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller 1830 or they may be provided over a network. In certain embodiments, the system controller 1830 executes system control software.

The system control software may include instructions for controlling the timing of application and/or magnitude of any one or more of the following chamber operational conditions: the mixture and/or composition of gases, chamber pressure, chamber temperature, wafer/wafer support temperature, the bias applied to the wafer, the frequency and power applied to coils or other plasma generation components, wafer position, wafer movement speed, and other parameters of a particular process performed by the tool. System control software may be configured in any suitable way. For example, various process tool component subroutines or control objects may be written to control operations of the process tool components necessary to carry out various process tool processes. System control software may be coded in any suitable compute readable programming language.

In some embodiments, system control software includes input/output control (IOC) sequencing instructions for controlling the various parameters described above. For example, each phase of a semiconductor fabrication process may include one or more instructions for execution by the system controller 1830. The instructions for setting process conditions for an etching phase may be included in a corresponding etching recipe phase, for example. In some embodiments, the recipe phases may be sequentially arranged, such that steps in a patterning process, such as the two-dimensional process, are executed in a certain order for that process phase.

Other computer software and/or programs may be employed in some embodiments. Examples of programs or sections of programs for this purpose include wafer positioning program, a process gas composition control program, a pressure control program, a heater control program, and an RF power supply control program.

In some cases, the controller 1830 controls gas concentration, wafer movement, and/or the power supplied to the coils 1833 and/or electrostatic chuck 1817. The controller 1830 may control the gas concentration by, for example, opening and closing relevant valves to produce one or more inlet gas stream that provide the necessary reactant(s) at the proper concentration(s). The wafer movement may be controlled by, for example, directing a wafer positioning system to move as desired. The power supplied to the coils 1833 and/or chuck 1817 may be controlled to provide particular RF power levels. If a grid 1850 is used, the RF powers may be adjusted by the system controller 1830 to create an electron-ion plasma in the upper sub-chamber 1802 and ion-ion plasma in the lower sub-chamber 1803. Further, the controller 1830 may be configured to supply power to an electrostatic chuck 1817 under conditions such that an election-ion plasma does not form in the lower sub-chamber 1803.

The system controller 1830 may control these and other aspects based on sensor output (e.g., when power, potential, pressure, etc. reach a certain threshold), the timing of an operation (e.g., opening valves at certain times in a process), or based on received instructions from the user.

Figure 19:
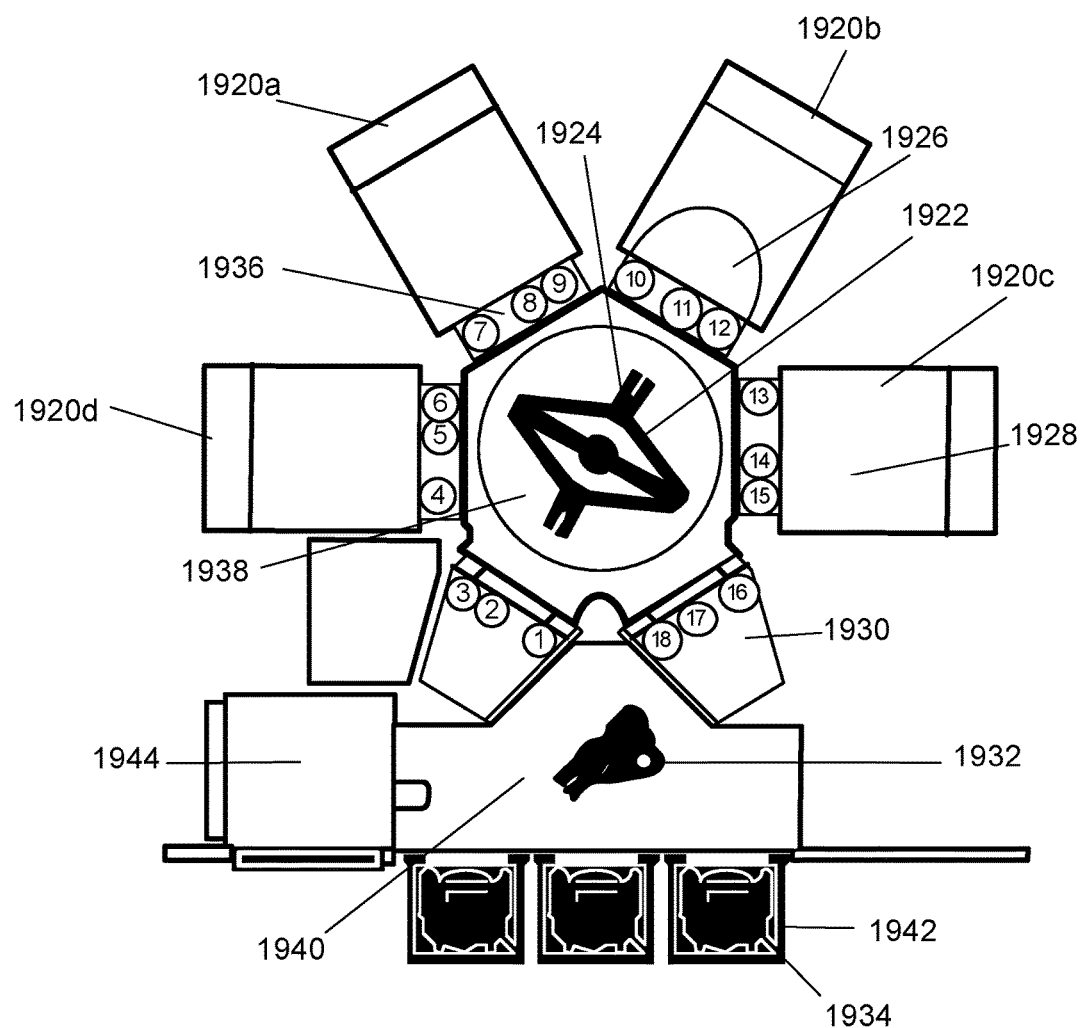
FIG. 19 depicts an embodiment of a multi-station cluster tool in accordance with disclosed embodiments.

FIG. 19 depicts a semiconductor process cluster architecture with various modules that interface with a vacuum transfer module 1938 (VTM). The arrangement of transfer modules to "transfer" wafers among multiple storage facilities and processing modules may be referred to as a "cluster tool architecture" system. Airlock module 1930, also known as a loadlock or transfer module, is shown in VTM 1938 with four processing modules 1920a-1920d, which may be individual optimized to perform various fabrication processes. By way of example, processing modules 1920a-1920d may be implemented to perform substrate etching, deposition, ion implantation, wafer cleaning, sputtering, and/or other semiconductor processes. One or more of the substrate etching processing modules (any of 1920a-1920d) may be implemented as disclosed herein, i.e., for depositing gap-fill AHM layers, depositing conformal films, etching patterns in single and two-dimensions, planarizing wafers, and other suitable functions in accordance with the disclosed embodiments. Airlock module 1930 and process module 1920 may be referred to as "stations." Each station has a facet 1936 that interfaces the station to VTM 1938. Inside each facet, sensors 1-18 are used to detect the passing of wafer 1926 when moved between respective stations.

Robot 1922 transfers wafer 1926 between stations. In one embodiment, robot 1922 has one arm, and in another embodiment, robot 1922 has two arms, where each arm has an end effector 1924 to pick wafers such as wafer 1926 for transport. Front-end robot 1932, in atmospheric transfer module (ATM) 1940, is used to transfer wafers 1926 from cassette or Front Opening Unified Pod (FOUP) 1934 in Load Port Module (LPM) 1942 to airlock 1930. Module center 1928 inside process module 1920 is one location for placing wafer 1926. Aligner 1944 in ATM 1940 is used to align wafers.

In an exemplary processing method, a wafer is placed in one of the FOUPs 1934 in the LPM 1942. Front-end robot 1932 transfers the wafer from the FOUP 1934 to an aligner 1944, which allows the wafer 1926 to be properly centered before it is etched or processed. After being aligned, the wafer 1926 is moved by the front-end robot 1932 into an airlock 1930. Because airlock modules have the ability to match the environment between an ATM and a VTM, the wafer 1926 is able to move between the two pressure environments without being damaged. From the airlock module 1930, the wafer 1926 is moved by robot 1922 through VTM 1938 and into one of the process modules 1920a-1920d. In order to achieve this wafer movement, the robot 1922 uses end effectors 1924 on each of its arms. Once the wafer 1926 has been processed, it is moved by robot 1922 from the process modules 1920a-1920d to an airlock module 1930. From here, the wafer 1926 may be moved by the front-end robot 1932 to one of the FOUPs 1934 or to the aligner 1944.

It should be noted that the computer controlling the wafer movement can be local to the cluster architecture, or can be located external to the cluster architecture in the manufacturing floor, or in a remote location and connected to the cluster architecture via a network.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A semiconductor processing tool, comprising:
   one or more process chambers;
   one or more gas inlets into the one or more process chambers and associated flow-control hardware;
   a low frequency radio frequency (LFRF) generator;
   a high frequency radio frequency (HFRF) generator; and
   a controller having at least one processor and a memory, wherein
   the at least one processor and the memory are communicatively connected with one another,
   the at least one processor is at least operatively connected with the flow-control hardware, the LFRF generator, and the HFRF generator, and
   the memory stores computer-executable instructions for controlling the at least one processor to at least control the flow-control hardware, the HFRF generator, and the LFRF generator to:
   etch a semiconductor substrate to transfer a pattern from an overlying photoresist to a core amorphous carbon layer on the semiconductor substrate;
   deposit a conformal film over the patterned core amorphous carbon layer on the semiconductor substrate;
   deposit a gap-fill amorphous carbon layer over the conformal film;
   planarize the semiconductor substrate with a process that etches both the conformal film and the gap-fill amorphous carbon layer to remove the conformal film overlying the core amorphous carbon layer without removing the conformal film deposited between the core amorphous carbon layer and the gap-fill amorphous carbon layer; and
   selectively etch the conformal film to form a mask.

2. The tool of claim 1, wherein the computer-executable instructions further include instructions for flowing oxygen and helium at about 20 sccm and about 200 sccm respectively in the planarization process.

3. The tool of claim 2, wherein the computer-executable instructions further include instructions for flowing $CF_4$ and Ar at about 5 sccm and about 100 sccm, respectively; and flowing $CHF_3$ and $CF_4$ at about 15 sccm and about 80 sccm, respectively in the planarization process.

4. The tool of claim 3, wherein the computer-executable instructions further include instructions for flowing oxygen and helium for about 30 seconds, flowing $CF_4$ and Ar for about 10 seconds, and flowing $CHF_3$ and $CF_4$ for about 30 seconds.

5. The tool of claim 1, wherein the computer-executable instructions further include setting the temperature of a pedestal holding the semiconductor substrate in the one or more process chambers to between about 10° C. and about 50° C. and setting the pressure of the one or more process chambers to between about 2 Torr and about 20 Torr.

6. The tool of claim 1, wherein the computer-executable instructions for depositing a gap-fill amorphous carbon layer further comprises instructions for
   (a) flowing a hydrocarbon using plasma enhanced chemical vapor deposition until a gap entry width between features in the pattern is reduced,
   (b) directionally sputtering ions generated from a plasma to anisotropically etch the semiconductor substrate with a dominant anisotropic axis substantially perpendicular to the semiconductor substrate,
   (c) repeating X cycles of (a) and (b), wherein X is a positive integer, and
   (d) ashing the semiconductor substrate to remove localized build-up of carbon film on a surface of the semiconductor substrate.

7. The tool of claim 6, wherein the hydrocarbon is selected from the group consisting of methane, acetylene, and propylene.

8. The tool of claim 1, wherein the computer-executable instructions further include instructions for etching a target layer using a mask.

9. The tool of claim 1, wherein the computer-executable instructions further include instructions for prior to etching etch the semiconductor substrate to transfer the pattern from an overlying photoresist to the core amorphous carbon layer, transferring the pattern from an overlying photoresist to a bottom anti-reflective layer and cap layer simultaneously by pulsing power.

10. A semiconductor processing tool comprising:
one or more process chambers;
one or more gas inlets into the process chambers and associated flow-control hardware;
a low frequency radio frequency (LFRF) generator;
a high frequency radio frequency (HFRF) generator; and
a controller having at least one processor and a memory, wherein
the at least one processor and the memory are communicatively connected with one another,
the at least one processor is at least operatively connected with the flow-control hardware, the LFRF generator, and the HFRF generator, and
the memory stores computer-executable instructions for controlling the at least one processor to at least control the flow-control hardware, the HFRF generator, and the LFRF generator to:
etch a semiconductor substrate in a first dimension to transfer a pattern from a first overlying photoresist to a core first amorphous carbon layer;
flow first conformal film material on the semiconductor substrate to form a first conformal film over the patterned core first amorphous carbon layer;
flow a first hydrocarbon to deposit a gap-fill second amorphous carbon layer over the first conformal film;
selectively etch the second amorphous carbon layer and first amorphous carbon layer to expose the patterned first conformal film;
etch an underlying etch stop layer using the patterned first conformal film;
flow a second hydrocarbon to deposit a third amorphous carbon layer over the etch stop layer;
deposit and lithographically define a second photoresist in a second dimension on the third amorphous carbon layer;
flow second conformal film material to form a second conformal film on the second patterned photoresist;
selectively etch the second conformal film to expose the second patterned photoresist;
selectively etch the third amorphous carbon layer selectively; and
selectively etch an underlying cap layer to form a two-dimensional mask.

11. The tool of claim 10, wherein the computer-executable instructions further comprise instructions for controlling the at least one processor to at least control the flow-control hardware, the HFRF generator, and the LFRF generator to: deposit and lithographically define a third photoresist on the second amorphous carbon layer to form a block mask and etch the second amorphous carbon layer selectively using the block mask.

12. The tool of claim 10, wherein the computer-executable instructions for flowing a hydrocarbon to deposit a third amorphous carbon layer further comprises instructions for
(a) flowing a hydrocarbon using plasma enhanced chemical vapor deposition until a gap entry width between features in the pattern is reduced,
(b) directionally sputtering ions generated from a plasma to anisotropically etch the semiconductor substrate with a dominant anisotropic axis substantially perpendicular to the semiconductor substrate,
(c) repeating X cycles of (a) and (b), wherein X is a positive integer, and
(d) ashing the semiconductor substrate to remove localized build-up of carbon film on a surface of the semiconductor substrate.

13. The tool of claim 12, wherein the hydrocarbon is selected from the group consisting of methane, acetylene, and propylene.

14. The tool of claim 10, wherein the second pattern further comprises features with aspect ratios between about 1:1 and about 5:1.

15. The tool of claim 10, wherein the computer-executable instructions further comprise instructions for patterning a target layer with the two-dimensional mask.

16. The tool of claim 10, wherein the computer-executable instructions for flowing the second conformal film material further comprises instructions for setting the temperature of a pedestal holding the semiconductor substrate to a temperature less than about 80° C.

* * * * *